(12) United States Patent
Hirose et al.

(10) Patent No.: US 12,126,344 B2
(45) Date of Patent: Oct. 22, 2024

(54) SEMICONDUCTOR DEVICE

(71) Applicant: Semiconductor Energy Laboratory Co., Ltd., Atsugi (JP)

(72) Inventors: Takeya Hirose, Atsugi (JP); Seiichi Yoneda, Isehara (JP); Yusuke Negoro, Kaizuka (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 9 days.

(21) Appl. No.: 18/008,287

(22) PCT Filed: Jul. 12, 2021

(86) PCT No.: PCT/IB2021/056221
§ 371 (c)(1),
(2) Date: Dec. 5, 2022

(87) PCT Pub. No.: WO2022/018560
PCT Pub. Date: Jan. 27, 2022

(65) Prior Publication Data
US 2023/0198509 A1  Jun. 22, 2023

(30) Foreign Application Priority Data

Jul. 24, 2020 (JP) ................... 2020-125992

(51) Int. Cl.
*H03K 3/356* (2006.01)
*H01L 29/786* (2006.01)

(52) U.S. Cl.
CPC .... *H03K 3/35613* (2013.01); *H01L 29/78648* (2013.01); *H01L 29/7869* (2013.01)

(58) Field of Classification Search
CPC .................................................. H03K 3/35613
USPC ........................................................ 327/210
See application file for complete search history.

(56) References Cited

U.S. PATENT DOCUMENTS

| | | | |
|---|---|---|---|
| 4,649,293 A | 3/1987 | Ducourant | |
| 8,816,662 B2 | 8/2014 | Takahashi et al. | |
| 8,836,376 B2 | 9/2014 | Danjo | |
| 9,007,736 B2 | 4/2015 | Uota et al. | |

(Continued)

FOREIGN PATENT DOCUMENTS

| | | |
|---|---|---|
| CN | 102655367 A | 9/2012 |
| EP | 0181664 A | 5/1986 |

(Continued)

OTHER PUBLICATIONS

International Search Report (Application No. PCT/IB2021/056221) Dated Aug. 31, 2021.

(Continued)

*Primary Examiner* — Tomi Skibinski
(74) *Attorney, Agent, or Firm* — Eric J. Robinson; Robinson Intellectual Property Law Office, P.C.

(57) ABSTRACT

A semiconductor device with low power consumption can be provided. The semiconductor device includes a differential circuit and a latch circuit, the differential circuit includes a transistor including an oxide semiconductor in a channel formation region, and the latch circuit includes a transistor including a single semiconductor or a compound semiconductor in a channel formation region. The differential circuit and the latch circuit include an overlap region.

11 Claims, 19 Drawing Sheets

(56) References Cited

U.S. PATENT DOCUMENTS

| | | | |
|---|---|---|---|
| 9,178,419 | B2 | 11/2015 | Ito et al. |
| 9,230,648 | B2 | 1/2016 | Matsubayashi |
| 9,245,589 | B2 | 1/2016 | Aoki et al. |
| 9,653,486 | B2 | 5/2017 | Kurokawa |
| 9,793,801 | B2 | 10/2017 | Takahashi et al. |
| 9,935,622 | B2 | 4/2018 | Miyake |
| 10,090,022 | B2 | 10/2018 | Shionoiri et al. |
| 10,224,906 | B2 | 3/2019 | Yamamoto |
| 10,236,875 | B2 | 3/2019 | Kato et al. |
| 10,250,247 | B2 | 4/2019 | Kato et al. |
| 10,693,448 | B2 | 6/2020 | Kato et al. |
| 10,944,396 | B2 | 3/2021 | Matsuzaki |
| 11,362,647 | B2 | 6/2022 | Okamoto et al. |
| 11,457,167 | B2 | 9/2022 | Matsuzaki et al. |
| 11,482,155 | B2 | 10/2022 | Hirose et al. |
| 11,531,362 | B2 | 12/2022 | Takahashi et al. |
| 2012/0224288 | A1 | 9/2012 | Uota et al. |
| 2014/0132437 | A1* | 5/2014 | Danjo ............... H03K 5/2445 327/214 |
| 2014/0286076 | A1 | 9/2014 | Aoki et al. |
| 2015/0035509 | A1 | 2/2015 | Koyama et al. |
| 2017/0230041 | A1* | 8/2017 | Kato ............... G11C 5/145 |
| 2018/0005668 | A1 | 1/2018 | Shionoiri et al. |
| 2022/0006309 | A1 | 1/2022 | Takahashi et al. |
| 2022/0011375 | A1 | 1/2022 | Takahashi et al. |
| 2022/0045370 | A1 | 2/2022 | Matsuzaki et al. |
| 2022/0052663 | A1 | 2/2022 | Sato et al. |

FOREIGN PATENT DOCUMENTS

| | | |
|---|---|---|
| FR | 2573211 | 5/1986 |
| JP | 61-120520 A | 6/1986 |
| JP | 2012-186899 A | 9/2012 |
| JP | 2014-096769 A | 5/2014 |
| JP | 2014-209727 A | 11/2014 |
| JP | 2017-192124 A | 10/2017 |
| JP | 2018-011294 A | 1/2018 |
| KR | 2018-0003432 A | 1/2018 |
| TW | 201501130 | 1/2015 |
| TW | 201812748 | 4/2018 |
| WO | WO-2014/157019 | 10/2014 |

OTHER PUBLICATIONS

Written Opinion (Application No. PCT/IB2021/056221) Dated Aug. 31, 2021.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Schinkel.D et al., "A Double-Tail Latch-Type Voltage Sense Amplifier with 18ps Setup+Hold Time", ISSCC 2007 (Digest of Technical Papers. IEEE International Solid-State Circuits Conference), 2007, pp. 314-315/605.

* cited by examiner

230a

230b

230c

230d

FIG. 17A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 17B
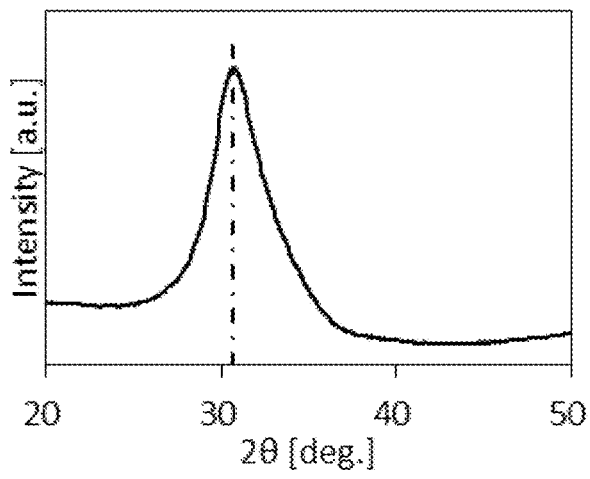
FIG. 17C
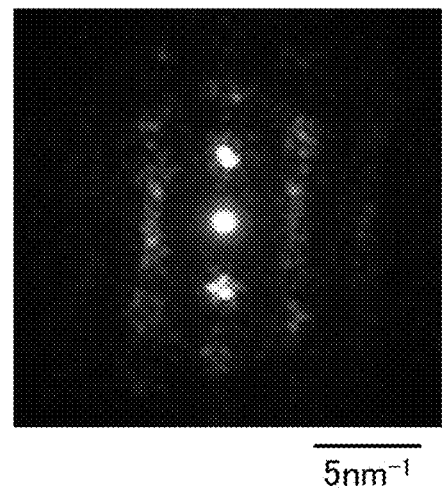

SEMICONDUCTOR DEVICE

TECHNICAL FIELD

One embodiment of the present invention relates to a semiconductor device.

The technical field of the invention disclosed in this specification and the like relates to an object, a method, or a manufacturing method. One embodiment of the present invention relates to a process, a machine, manufacture, or a composition of matter.

Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof. Note that one embodiment of the present invention is not limited to the above technical field.

BACKGROUND ART

A comparator is known for outputting a comparison result of two analog signals or one analog signal and a reference signal as binary data, High or Low. A continuous type comparator and a synchronous type (dynamic type) comparator are known as the comparator. The continuous type comparator allows current to flow even in a standby period. The synchronous type comparator drives switching between a precharge period and an evaluation period and allows current to flow only when needed. Accordingly, the power consumption of a synchronous type comparator is lower than that of the continuous type comparator.

The comparator is also used for, for example, an analog-to-digital converter (ADC) which converts analog data (also referred to as an "analog signal") to digital data (also referred to as a "digital signal").

A semiconductor device such as the comparator is fabricated using a single semiconductor which includes one kind of element such as Si (silicon) as its main component, a compound semiconductor which includes a plurality of kinds of elements such as Ga (gallium) and As (arsenic) as its main component, for example. Furthermore, in recent years, an oxide semiconductor, which is one kind of metal oxides, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2). Non-Patent Document 1 and Non-Patent Document 2 disclose a technique for manufacturing a transistor using an oxide semiconductor having a CAAC structure.

REFERENCES

Non-Patent Documents

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

A semiconductor device such as a comparator has been required to have a further reduction in power consumption. In Si processing, leakage current is likely to increase due to miniaturization, and thus the reduction in power consumption is difficult. Further, an increase in the leakage current tends to cause a problem of short retention period for input data. Furthermore, when power supply voltage is decreased by miniaturization, the amplitude of a signal input to the semiconductor device needs to be small. When the amplitude of input voltage is small, the resolution capacity of the ADC using the comparator is decreased.

An object of one embodiment of the present invention is to provide a semiconductor device or the like with reduced power consumption. Another object is to provide a highly reliable semiconductor device or the like. Another object is to provide a semiconductor device or the like that occupies a small area. Another object is to provide a novel semiconductor device or the like.

Note that the description of these objects does not preclude the existence of other objects. Note that in one embodiment of the present invention, there is no need to achieve all the objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a differential circuit and a latch circuit, in which the differential circuit includes a transistor containing an oxide semiconductor in a channel formation region, the latch circuit includes a transistor containing a single semiconductor or a compound semiconductor in a channel formation region, the differential circuit and the latch circuit include an overlap region.

Another embodiment of the present invention is a semiconductor device including a differential circuit and a latch circuit, in which the differential circuit includes first to fifth transistors, the latch circuit includes sixth to twelfth transistors, each of the first to fifth transistors includes an oxide semiconductor in a channel formation region, and each of the sixth to twelfth transistors includes a single semiconductor or a compound semiconductor in a channel formation region.

Another embodiment of the present invention is a semiconductor device including a differential circuit and a latch circuit, in which the differential circuit includes first to fifth transistors, the latch circuit includes sixth to twelfth transistors, each of the first to fifth transistors, the eleventh transistor, and the twelfth transistor includes an oxide semiconductor in a channel formation region, and each of the sixth to tenth transistors includes a single semiconductor or a compound semiconductor in a channel formation region.

In addition, it may be possible, for example, that one of a source and a drain of the first transistor is electrically connected to a first terminal, the other of the source and the drain of the first transistor is electrically connected to one of a source and a drain of the third transistor, one of a source and a drain of the second transistor is electrically connected to the first terminal, the other of the source and the drain of the second transistor is electrically connected to one of a source and a drain of the fourth transistor, the other of the source and the drain of the third transistor and the other of the source and the drain of the fourth transistor are electrically connected to one of a source and a drain of the fifth transistor, a gate of the first transistor and a gate of the second transistor are electrically connected to a second terminal, a gate of the third transistor is electrically connected to a third terminal, a gate of the fourth transistor is electrically connected to a fourth terminal, a gate of the fifth transistor is electrically connected to a fifth terminal, and the other of the source and the drain of the fifth transistor is electrically connected to a sixth terminal.

Furthermore, it may also be possible, for example, that one of a source and a drain of the sixth transistor is electrically connected to a seventh terminal, the other of the source and the drain of the sixth transistor is electrically connected to one of a source and a drain of the seventh transistor, the other of the source and the drain of the seventh transistor is electrically connected to one of a source and a drain of the ninth transistor, one of a source and a drain of the eighth transistor is electrically connected to the other of the source and the drain of the sixth transistor, a gate of the sixth transistor is electrically connected to the eighth terminal, the other of the source and the drain of the eighth transistor is electrically connected to one of a source and a drain of the tenth transistor, each of gates of the seventh transistor and the ninth transistor is electrically connected to the one of the source and the drain of the tenth transistor, each of gates of the eighth transistor and the tenth transistor is electrically connected to the one of the source and the drain of the ninth transistor, one of a source and a drain of the eleventh transistor is electrically connected to a ninth terminal and the one of the source and the drain of the ninth transistor, one of a source and a drain of the twelfth transistor is electrically connected to a tenth terminal and the one of the source and the drain of the tenth transistor, the other of the source and the drain of each of the ninth transistor, the tenth transistor, the eleventh transistor, and the twelfth transistor is electrically connected to an eleventh terminal, a gate of the eleventh transistor is electrically connected to the one of the source and the drain of the third transistor, and a gate of the twelfth transistor is electrically connected to the one of the source and the drain of the fourth transistor.

The oxide semiconductor preferably contains at least one of indium and zinc. As the semiconductor of a single element, silicon can be given for example. An example of the compound semiconductor can be gallium nitride.

Effect of the Invention

According to one embodiment of the present invention, a semiconductor device or the like with reduced power consumption can be provided. Alternatively, a highly reliable semiconductor device or the like can be provided. Alternatively, a semiconductor device or the like that occupies a small area can be provided. Alternatively, a novel semiconductor device or the like can be provided.

Note that the description of these effects does not preclude the existence of other effects. Note that in one embodiment of the present invention, there is no need to achieve all the effects. Other effects will be apparent from the descriptions of the specification, the drawings, the claims, and the like, and other effects can be derived from the descriptions of the specification, the drawings, the claims, and the like.

BRIEF DESCRIPTION OF THE DRAWINGS

FIG. 17A is a diagram showing classification of crystal structures, FIG. 17B is a diagram showing an XRD spectrum of crystalline IGZO, and FIG. 17C is a diagram showing a nanobeam electron diffraction pattern of crystalline IGZO.

MODE FOR CARRYING OUT THE INVENTION

Figure 1A:
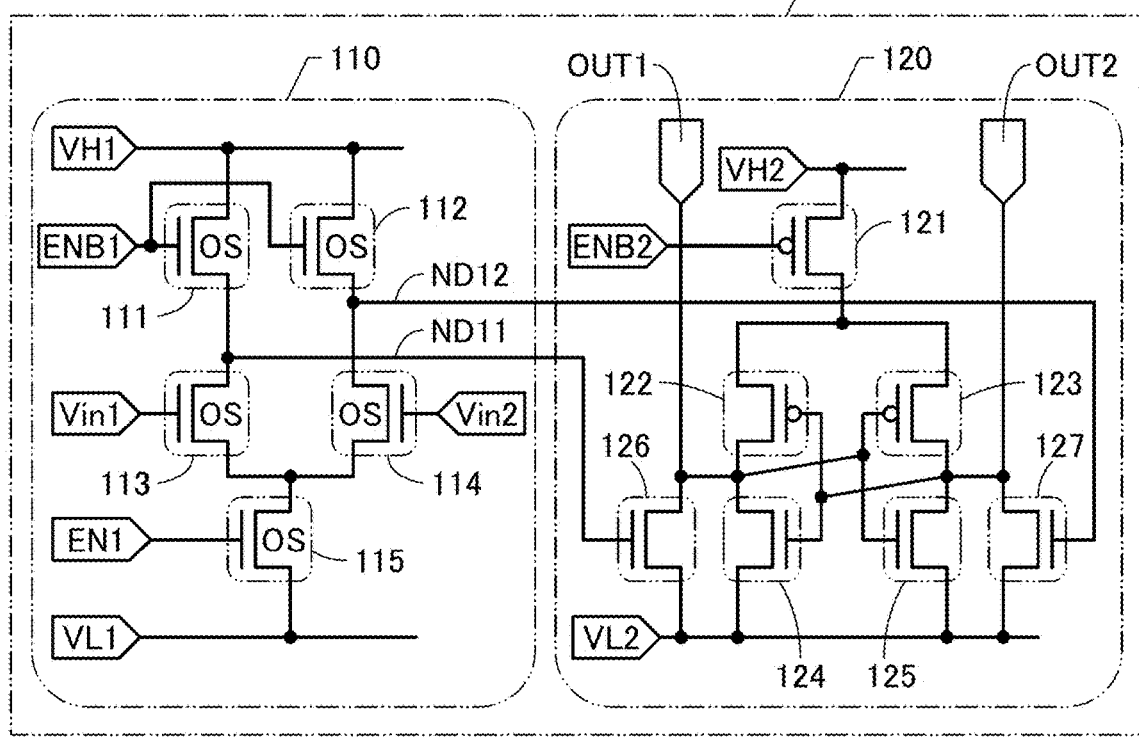
FIG. 1A is a circuit diagram of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

In this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electro-optical device, a communication device, an electronic device, and the like themselves might be semiconductor devices, or might include semiconductor devices.

Furthermore, in the case where this specification and the like state that X and Y are connected, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of being in a conduction state (on state) or a non-conduction state (off state) to control whether or not current flows.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For example, even when another circuit is interposed between X and Y, X and Y are functionally connected when a signal output from X is transmitted to Y.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) of a transistor and a drain (or a second terminal or the like) of the transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" includes a wiring having a resistance value, a transistor in which current flows between its source and drain, a diode, an inductor, or the like. Thus, the term "resistor" can be replaced with the term such as "resistance", "load", or "region having a resistance value"; inversely, the term "resistance", "load", or "region having a resistance value" can be replaced with the term such as "resistor". The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1 \times 10^9$ Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. Furthermore, the term such as "capacitor", "parasitic capacitance", or "gate capacitance" can be replaced with the term such as "capacitance"; inversely, the term "capacitance" can be replaced with the term such as "capacitor", "parasitic capacitance", or "gate capacitance". Moreover, the term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In addition, in this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in some cases in the description of the connection relation of a transistor. Depending on the transistor structure, a transistor may include a back gate in addition to the above three terminals. In that case, in this specification and the like, one of the gate and the back gate of the transistor is sometimes referred to as a first gate, and the other of the gate and the back gate of the transistor is sometimes referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, "a node" can be referred to as a terminal, a wiring, an electrode, a conductive layer, a conductor, an impurity region, and the like depending on the circuit structure, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, a high power supply potential VDD (hereinafter, also simply referred to as "VDD") is a power supply potential higher than a low power supply potential VSS (hereinafter, also simply referred to as "VSS"). VSS refers to a power supply potential at a potential lower than VDD. A ground potential (hereinafter, also simply referred to as "GND") can be used as VDD or VSS. For example, in the case where VDD is a ground potential, VSS is a potential lower than the ground potential, and in the case where VSS is a ground potential, VDD is a potential higher than the ground potential. A potential difference between VDD and VSS is also referred to as a power supply voltage.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, a complex ion, and the like, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of a current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number or the order of components. In this specification and the like, for example, a "first" component in one embodiment can be referred to as a "second" component in other embodiments or the scope of claims. For another example, a "first" component in one embodiment in this specification and the like can be omitted in other embodiments or the scope of claims.

The term "over" or "under" does not necessarily mean that a component is placed directly on or directly under and directly in contact with another component. For example, the expression "electrode B over insulating layer A" does not necessarily mean that the electrode B is formed on and in direct contact with the insulating layer A, and does not exclude the case where another component is provided between the insulating layer A and the electrode B.

The positional relation between components changes as appropriate in accordance with the direction in which each component is described. Thus, the positional relationship is not limited to the terms described in the specification and the like, and can be described with another term as appropriate depending on the situation. For example, in this specification and the like, terms for describing arrangement, such as "over" and "under", are sometimes used for convenience to describe the positional relation between components with reference to drawings. Accordingly, the expression "an insulator positioned over (on) a top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°.

Similarly, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms "film", "layer", or the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term such as "electrode", "wiring", or "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For another example, a "terminal" is sometimes used as part of a "wiring" or an "electrode", and vice versa. Furthermore, the term "terminal" also includes the case where a plurality of "electrodes", "wirings", "terminals", and the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In addition, in this specification and the like, the term such as "wiring", "signal line", or "power supply line" can be interchanged with each other depending on the case or the situation. For example, the term "wiring" can be changed into the term "signal line" in some cases. As another example, the term "wiring" can be changed into the term "power supply line" or the like in some cases. Inversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can be sometimes changed into the term such as "signal" depending on the case or the situation. Inversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Furthermore, when the semiconductor is silicon, examples of an impurity that changes characteristics of the semiconductor include oxygen, Group 1 elements except hydrogen, Group 2 elements, Group 13 elements, and Group 15 elements.

Unless otherwise specified, transistors described in this specification and the like are enhancement (normally-off) n-channel field-effect transistors. Thus, the threshold voltage (also referred to as "Vth") is higher than 0 V.

In this specification and the like, a switch is in a conduction state (on state) or in a non-conduction state (off state) to determine whether current flows or not. Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, the terms "identical", "same", "equal", "uniform", and the like used in describing calculation values and measurement values or in describing objects, methods and the like that can be converted into calculation values or measurement values allow for a margin of error of ±20% unless otherwise specified.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where "an OS transistor" is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that content (or may be part of the content) described in one embodiment can be applied to, combined with, or replaced with at least one of another content (or may be part of the content) in the embodiment and content (or may be part of the content) described in one or a plurality of different embodiments.

Note that in each embodiment (or Example), content described in the embodiment is content described using a variety of diagrams or content described with text described in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily understood by those skilled in the art that the modes and details can be modified in various ways without departing from the spirit and scope thereof. Therefore, the present invention should not be construed as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the diagrams in some cases.

In this specification and the like, components are classified on the basis of the functions, and shown as blocks independent of one another in block diagrams. However, in an actual circuit or the like, it is difficult to separate components on the basis of the functions, and there may be a case where one circuit is associated with a plurality of functions or a case where a plurality of circuits are associated with one function. Therefore, blocks in the block diagrams are not limited by the components described in this specification, and the description can be changed appropriately depending on the situation.

In the drawings and the like, the size, the layer thickness, or the region is exaggerated for clarity in some cases. Therefore, embodiments of the present invention are not limited to the size, aspect ratio, and the like shown in the drawings and the like. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In the drawings and the like, for easy understanding of the potentials of a wiring, an electrode or the like, "H" representing a potential H or "L" representing a potential L is sometimes written near the wiring, the electrode, or the like. In addition, enclosed "H" or "L" is sometimes written near a wiring, an electrode, or the like whose potential changes. Moreover, a symbol "x" is sometimes written on a transistor in an off state.

In this specification and the like, when a plurality of components are denoted with the same reference numerals, and in particular need to be distinguished from each other, an identification sign such as "_1", "[n]", "[m, n]", or "a" is sometimes added to the reference numerals. For example, one of two wirings GL is referred to as a wiring GL[1] and the other is referred to as a wiring GL[2] in some cases.

Embodiment 1

A semiconductor device 100 of one embodiment of the present invention will be described with reference to drawings.

<Structure Example of Semiconductor Device 100>

FIG. 1A shows a circuit diagram of the semiconductor device 100 of one embodiment of the present invention. The semiconductor device 100 includes a differential circuit 110 and a latch circuit 120.

[Differential Circuit 110]

The differential circuit 110 includes a transistor 111 to a transistor 115. One of a source and a drain of the transistor 111 is electrically connected to a terminal VH1 and the other of the source and the drain of the transistor 111 is electrically connected to one of a source and a drain of the transistor 113. A gate of the transistor 111 is electrically connected to a terminal ENB1.

The other of the source and the drain of the transistor 113 is electrically connected to one of a source and a drain of the transistor 115. A gate of the transistor 113 is electrically connected to a terminal Vin1. The other of the source and the drain of the transistor 115 is electrically connected to a terminal VL1. A gate of the transistor 115 is electrically connected to a terminal EN1.

One of a source and a drain of the transistor 112 is electrically connected to the terminal VH1, and the other of the source and the drain of the transistor 112 is electrically connected to one of a source and a drain of the transistor 114. A gate of the transistor 112 is electrically connected to the terminal ENB1. The other of the source and the drain of the transistor 114 is electrically connected to the one of the source and the drain of the transistor 115. A gate of the transistor 114 is electrically connected to a terminal Vin2.

A node where the other of the source and the drain of the transistor 111 and the one of the source and the drain of the transistor 113 are electrically connected to each other functions as a node ND11. Furthermore, a node where the other of the source and the drain of the transistor 112 and the one of the source and the drain of the transistor 114 are electrically connected to each other functions as a node ND12.

As each of the transistor 111 to the transistor 115, a transistor including an oxide semiconductor, which is a kind of a metal oxide, in a channel formation region (also referred to as an "OS transistor") is preferably used. An oxide semiconductor has a band gap of 2 eV or more; thus, an OS transistor has an extremely low off-state current. For example, the off-state current per micrometer in channel width at a source-drain voltage of 3.5 V and at room temperature (25° C.) can be lower than $1 \times 10^{-20}$ A, lower than $1 \times 10^{-22}$ A, or lower than $1 \times 10^{-24}$ A. When the semiconductor device 100 is in a standby state, leakage current from the terminal VH1 to the terminal VL1 can be extremely small by using an OS transistor as each of the transistor 111 to the transistor 115.

In addition, an OS transistor has a higher heat resistance than a Si transistor (a transistor containing silicon in a channel formation region), and thus deterioration or the like of transistor characteristics (e.g., field-effect mobility) due to the temperature rise is less likely to occur. When an OS transistor is used as a transistor included in the semiconductor device 100, stable operation can be achieved even in a high-temperature environment. Moreover, since an OS transistor has high withstand voltage, a voltage higher than that of a Si transistor can be applied.

Examples of an oxide semiconductor that is included in an OS transistor include a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), and the like. The use of an oxide semiconductor containing Ga as M for an OS transistor is particularly preferable because electrical characteristics such as field-effect mobility of the transistor can be made excellent by adjusting the ratio of elements. In addition, an oxide containing indium (In) and zinc (Zn) may contain one or more kinds selected from aluminum (Al), gallium (Ga), yttrium (Y), copper (Cu), vanadium (V), beryllium (Be), boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like.

The oxide semiconductor has features in that the bandgap is wide, electrons are less likely to be excited, and the effective mass of a hole is large. Accordingly, an avalanche breakdown and the like are less likely to occur in an OS transistor than in a Si transistor, in some cases. Therefore, for example, an OS transistor inhibits hot-carrier degradation or the like that is caused by avalanche breakdown. Since hot-carrier degradation can be inhibited, an OS transistor can be driven at a high drain voltage.

An OS transistor is an accumulation transistor in which electrons are majority carriers. Therefore, DIBL (Drain-Induced Barrier Lowering), which is one of short-channel effects, is less likely to occur in an OS transistor than in an inversion transistor having a pn junction (typically a Si transistor). In other words, an OS transistor has higher resistance against short-channel effects than a Si transistor.

Owning to its high resistance against short-channel effects, an OS transistor can have a reduced channel length without deterioration in reliability. Accordingly, the use of an OS transistor can increase the integration degree of a circuit. Although a reduction in channel length due to miniaturization enhances a drain electric field, avalanche breakdown is less likely to occur in an OS transistor than in a Si transistor, as described above.

Since an OS transistor has a high resistance against short-channel effects, a gate insulating film can be made thicker than that of a Si transistor. For example, even in a minute transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in current consumption.

Note that an oxide semiconductor will be described in detail in Embodiment 3.

A high power supply potential VDD1 is supplied to the terminal VH1, and a low power supply potential VSS1 is supplied to the terminal VL1. The potential of the high power supply potential VDD1 may be the same as or different from that of a high power supply potential VDD2 described later. In the case where an OS transistor is used as each of the transistor 111 to the transistor 115, the high power supply potential VDD1 can be higher than the high power supply potential VDD2.

A potential H or a potential L is supplied to the terminal EN1. The potential H or the potential L is supplied also in the terminal ENB1. A different potential is supplied to each of the terminal EN1 and the terminal ENB1. That is, when the potential H is supplied to the terminal EN1, the potential L is supplied to the terminal EN1. Similarly, when the potential L is supplied to the terminal EN1, the potential H is supplied to the terminal EN1.

Here, the potential H is a potential at which the n-channel transistor is turned on, and the potential L is a potential at which the n-channel transistor is turned off. The potential H is a potential at which the p-channel transistor is turned off, and the potential L is a potential at which the p-channel transistor is turned on.

Input signals for comparing a magnitude of the potentials are supplied to the terminal Vin1 and the terminal Vin2. Alternatively, a reference potential (a potential Vref) may be supplied to one of the terminal Vin1 and the terminal Vin2 and an input signal may be supplied to the other terminal. The reference potential and the potential of an input signal are the potentials at which transistors are turned on. Thus, the reference potential and the potential of an input signal are larger than the threshold voltages of the transistor 113 and the transistor 114.

Note that the transistor 111 and the transistor 112 preferably have the same electric characteristics. In particular, gate voltages, at which transconductance (gm) is the largest, of the transistor 111 and the transistor 112 are preferably equal to each other. For example, it is preferable that the transistor 111 and the transistor 112 have the same channel length and the transistor 111 and the transistor 112 have the same channel width. The transistor 111 and the transistor 112 preferably have the same composition of the main component of the semiconductor. It is also preferable that the crystallinity of the semiconductors be equal to each other.

The transistor 113 and the transistor 114 preferably have the same electric characteristics. In particular, the gate voltages of the transistor 113 and the transistor 114 are preferably equal to each other when gm is the largest. For example, it is preferable that the transistor 113 and the transistor 114 have the same channel length and the transistor 113 and the transistor 114 have the same channel width. Furthermore, the transistor 113 and the transistor 114 preferably have the same composition of the main component of the semiconductor. It is also preferable that the crystallinity of the semiconductors be equal to each other.

[Latch Circuit 120]

The latch circuit 120 includes a transistor 121 to a transistor 127. FIG. 1A illustrates an example in which a p-channel transistor is used as each of the transistor 121 to the transistor 123.

One of a source and a drain of the transistor 121 is electrically connected to a terminal VH2 and the other of the source and the drain of the transistor 121 is electrically connected to one of a source and a drain of a transistor 122. A gate of the transistor 121 is electrically connected to a terminal ENB2.

The other of the source and the drain of the transistor 112 is electrically connected to one of a source and a drain of a transistor 124. The other of the source and the drain of the transistor 124 is electrically connected to a terminal VL2. A gate of the transistor 122 is electrically connected to a gate of the transistor 124.

One of a source and a drain of a transistor 123 is electrically connected to the other of the source and the drain of the transistor 121. The other of the source and the drain of the transistor 123 is electrically connected to one of a source and a drain of a transistor 125. The other of the source and the drain of the transistor 125 is electrically connected to the terminal VL2. A gate of the transistor 123 is electrically connected to a gate of the transistor 125.

One of a source and a drain of a transistor 126 is electrically connected to the one of the source and the drain of the transistor 124, the gate of the transistor 125, and a terminal OUT1. The other of the source and the drain of the transistor 126 is electrically connected to the terminal VL2. A gate of the transistor 126 is electrically connected to the node ND11.

One of a source and a drain of a transistor 127 is electrically connected to the one of the source and the drain of the transistor 125, the gate of the transistor 124, and a terminal OUT2. The other of the source and the drain of the transistor 127 is electrically connected to the terminal VL2. A gate of the transistor 127 is electrically connected to the node ND12.

For semiconductors forming the channels of the transistor 121 to the transistor 127, a single crystal semiconductor, a polycrystalline semiconductor, a microcrystalline semiconductor, an amorphous semiconductor, or the like can be used alone or in combination. As a semiconductor material, for example, a single semiconductor containing one kind of element as its main component, such as silicon or germanium, can be used. Alternatively, a compound semiconductor such as silicon germanium, silicon carbide, gallium arsenide, or a nitride semiconductor may be used.

Alternatively, gallium arsenide, aluminum gallium arsenide, indium gallium arsenide, gallium nitride, indium phosphide, silicon germanium, or the like that can be used for a high electron mobility transistor (HEMT) may be used.

Note that semiconductors may be stacked. In the case of stacking semiconductors, semiconductors having different crystal states may be used or different semiconductor materials may be used.

Figure 1B:
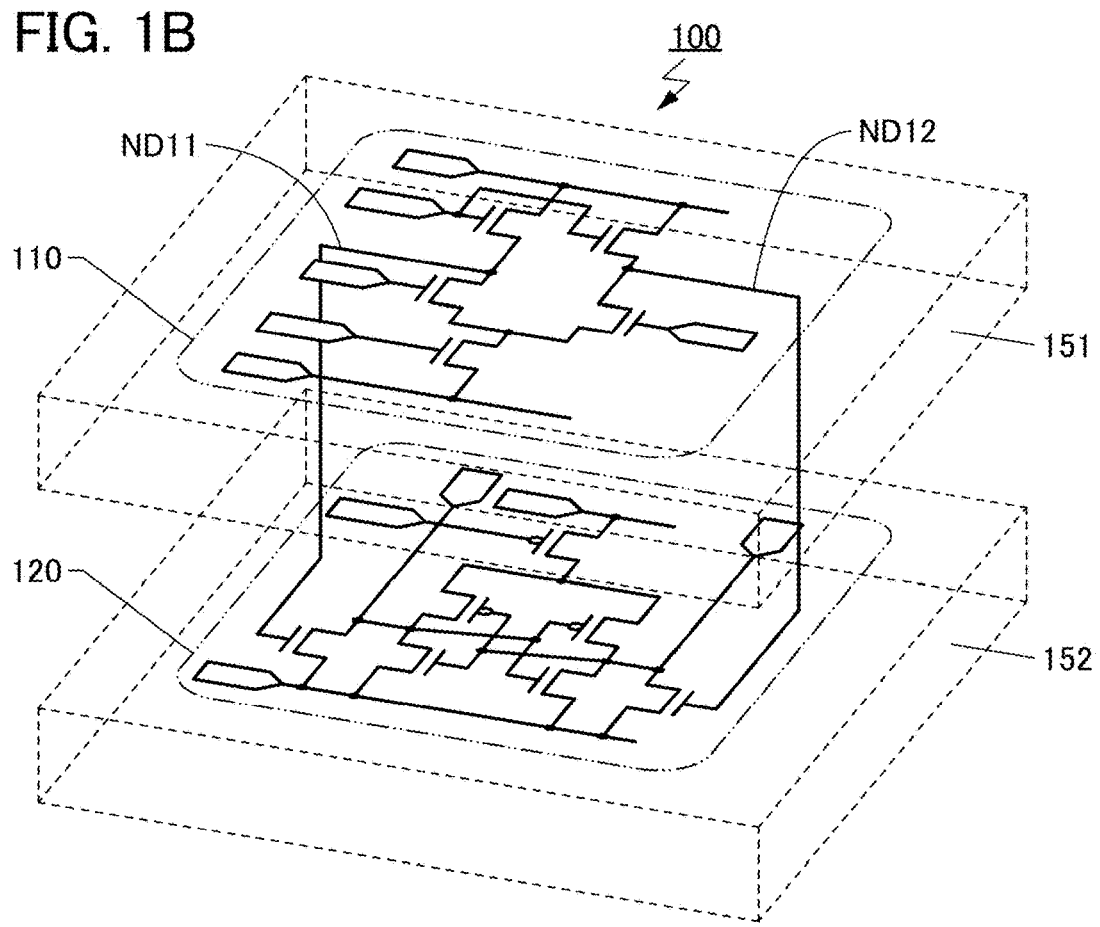
FIG. 1B is a conceptual perspective view of the semiconductor device.

The oxide semiconductors can be formed by a sputtering method or an ALD (Atomic Layer Deposition) method. When the differential circuit 110 is formed with an OS transistor, the differential circuit 110 and the latch circuit 120 can be provided overlapping with each other. FIG. 1B is a conceptual perspective view in the case where the differential circuit 110 provided in a first layer 151 and the latch circuit 120 provided in a second layer 152 are formed to overlap with each other. The area occupied by a semiconductor device can be reduced by providing the differential circuit 110 and the latch circuit 120 overlapping with each other. Note that in FIG. 1B, the first layer 151 and the second layer 152 are shown separately for easily understanding the structure of the semiconductor device 100. The semiconductor device of one embodiment of the present invention is not limited thereto; the first layer 151 and the second layer 152 may be in contact with each other or another layer may be provided between the first layer 151 and the second layer 152.

The high power supply potential VDD2 is supplied to the terminal VH2 and a low power supply potential VSS2 is supplied to the terminal VL2. The low power supply potential VSS2 preferably have the same potential as the low power supply potential VSS1. The potential H or the potential L is supplied to the terminal ENB2. Synchronized signals are supplied to the terminal ENB1 and the terminal ENB2. That is, when the potential H is supplied to the terminal ENB1, the potential H is supplied also to the terminal ENB2. Note that the potential H supplied to the terminal ENB1 and the potential H supplied to the terminal ENB2 are not necessarily the same potential. The potential L supplied to the terminal ENB1 and the potential L supplied to the terminal ENB2 are not necessarily the same.

Note that the transistor 122 and the transistor 123 preferably have the same electrical characteristics. In particular, gate voltages, at which transconductance (gm) is the largest, of the transistor 122 and the transistor 123 are preferably equal to each other. For example, it is preferable that the transistor 122 and the transistor 123 have the same channel length and the transistor 122 and the transistor 123 have the same channel width. The transistor 122 and the transistor 123 preferably have the same composition of the main component of the semiconductor. It is also preferable that the crystallinity of the semiconductors be equal to each other.

The transistor 124 and the transistor 125 preferably have the same electric characteristics. In particular, the gate voltages of the transistor 124 and the transistor 125 are preferably equal to each other when gm is the largest. For example, it is preferable that the transistor 124 and the transistor 125 have the same channel length and the transistor 124 and the transistor 125 have the same channel width. The transistor 124 and the transistor 125 preferably have the same composition of the main components of semiconductors. It is also preferable that the crystallinity of the semiconductors be equal to each other.

Modification Example 1

Figure 2A:
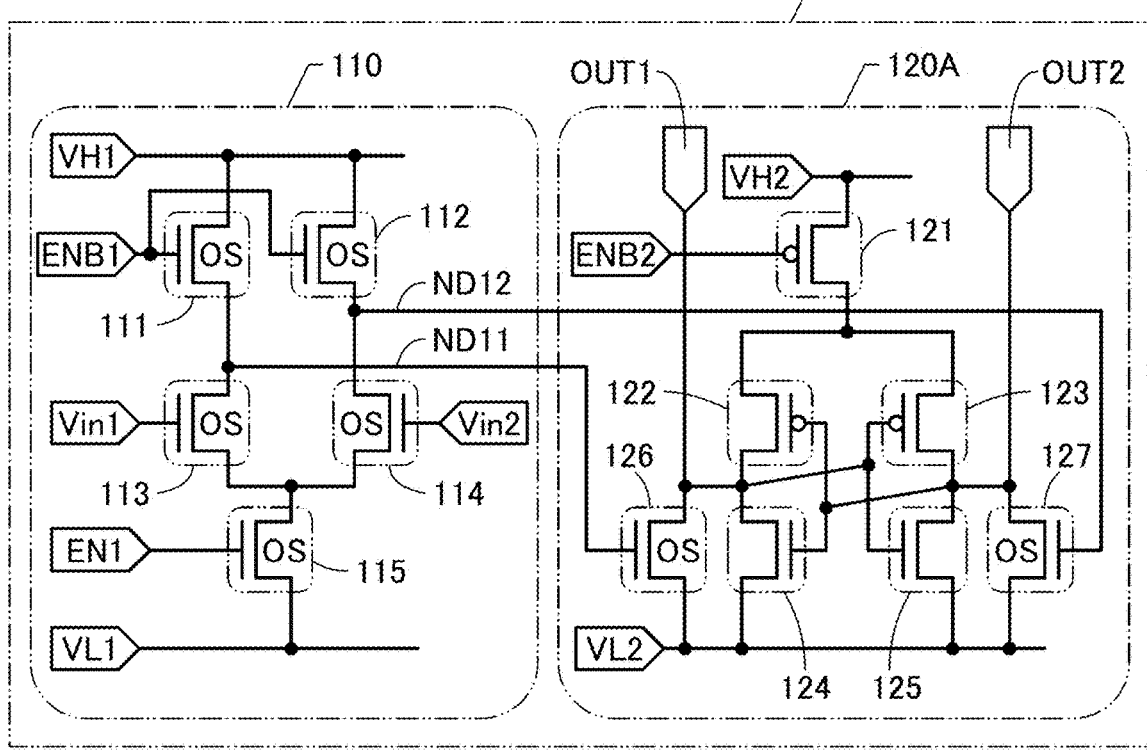
FIG. 2A is a circuit diagram of a semiconductor device.

FIG. 2A shows a circuit diagram of a semiconductor device 100A of one embodiment of the present invention. The semiconductor device 100A is a modification example of the semiconductor device 100. Therefore, differences of the semiconductor device 100A from the semiconductor device 100 are mainly described. The semiconductor device 100A includes a latch circuit 120A instead of the latch circuit 120 of the semiconductor device 100. The latch circuit 120A is different from the latch circuit 120 in that an OS transistor is used as each of the transistor 126 and the transistor 127.

As described above, the OS transistor has high withstand voltage. When the OS transistor is used as each of the transistor 126 and the transistor 127, the latch circuit 120A can be stably operated even when the output potential of the differential circuit 110 (the potential of the node ND11 or the potential of the node ND12) is high.

In addition, the off-state current of the OS transistor is extremely low. By turning off the transistor 126, leakage current between the terminal OUT1 and the terminal VL2 through the transistor 126 can be extremely low. Similarly, by turning off the transistor 127, leakage current between the terminal OUT2 and the terminal VL2 through the transistor 127 can be extremely low. Thus, the number of current paths between the terminal OUT1 and the terminal VL2 and the number of current paths between the terminal OUT2 and the terminal VL2 are reduced, so that power consumption of the semiconductor device 100 can be reduced.

Figure 2B:
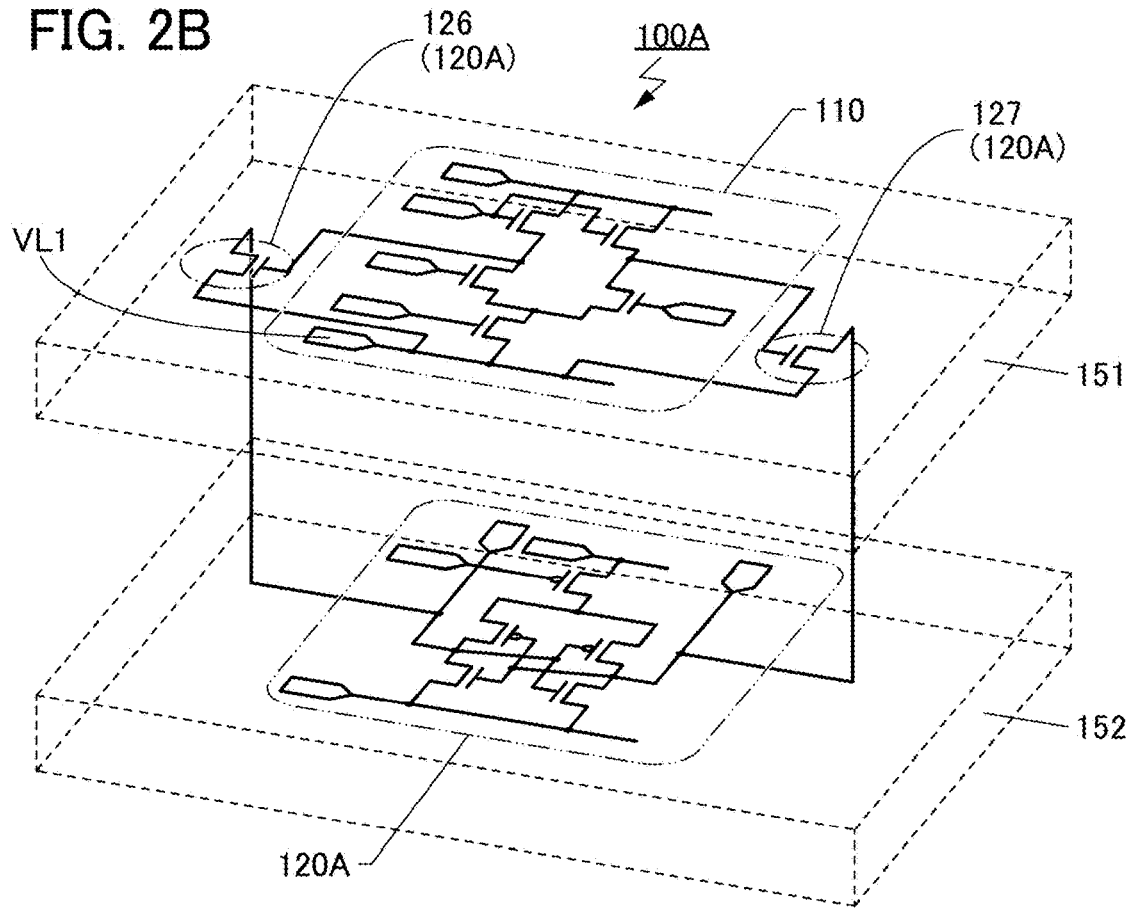
FIG. 2B is a conceptual perspective view of the semiconductor device.

FIG. 2B shows a perspective view of the semiconductor device 100A. When an OS transistor is used as each of the transistor 126 and the transistor 127 as illustrated in FIG. 2B, the transistor 126 and the transistor 127 may be provided in the first layer 151. That is, part of the latch circuit 120A may be provided in the first layer 151.

When the transistor 126 is provided in the first layer 151, the other of the source and the drain of the transistor 126 may be electrically connected to the terminal VL1. Similarly, when the transistor 127 is provided in the first layer 151, the other of the source and the drain of the transistor 127 may be electrically connected to the terminal VL1.

Modification Example 2

Figure 3A:
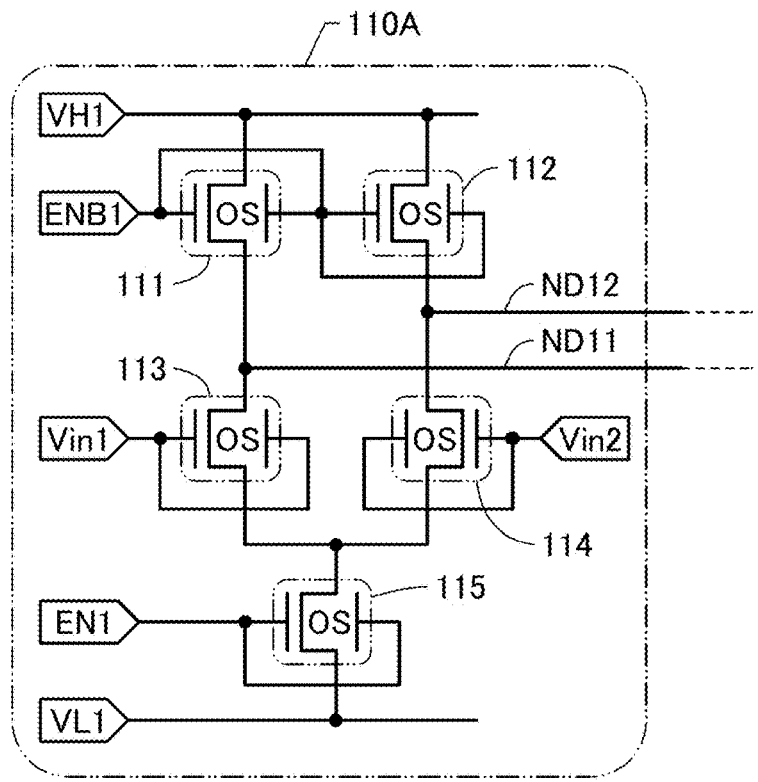
FIG. 3A and FIG. 3B are each a circuit diagram of one embodiment of the present invention.
Figure 3B:
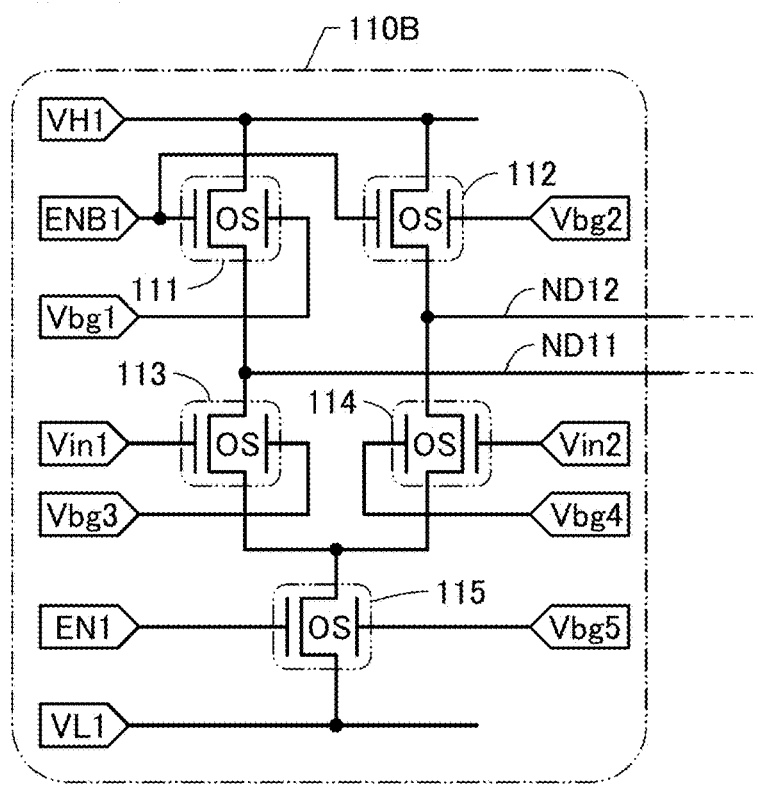
Figure 4A:
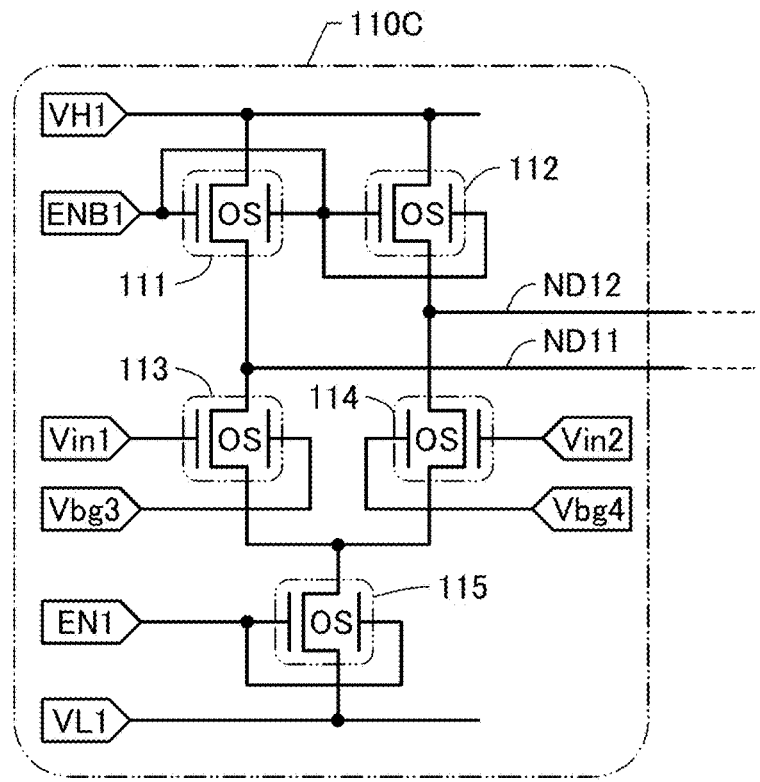
FIG. 4A and FIG. 4B are each a circuit diagram of one embodiment of the present invention.
Figure 4B:
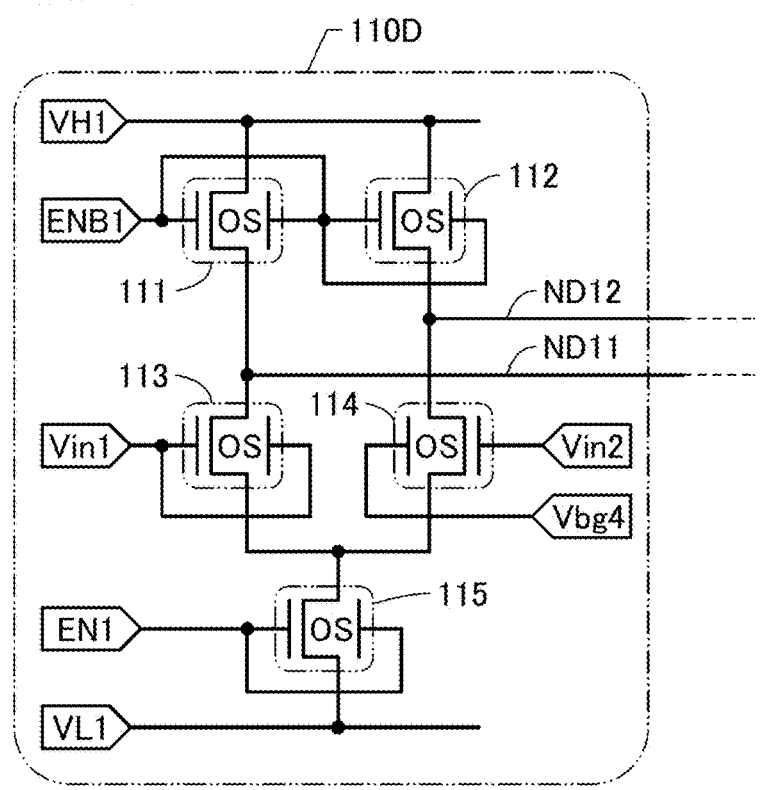

FIG. 3A shows a circuit diagram of a differential circuit 110A. FIG. 3B shows a circuit diagram of a differential circuit 110B. FIG. 4A shows a circuit diagram of a differential circuit 110C. FIG. 4B shows a circuit diagram of a differential circuit 110D. FIG. 6 shows a circuit diagram of a differential circuit 110E. The differential circuit 110A to the differential circuit 110E are modification examples of the differential circuit 110. Thus, differences from the differential circuit 110 are mainly described here.

In the differential circuit 110A, a transistor having a back gate is used as each of the transistor 111 to the transistor 115. The back gate is positioned so that a channel formation region of a semiconductor is sandwiched between the gate and the back gate. The back gate can function like the gate. In the differential circuit 110A, the gate and the back gate are electrically connected to each other in each of the transistor 111 to the transistor 115. Thus, the gate and the back gate always have the same potential in each of the transistor 111 to the transistor 115.

FIG. 3B shows the circuit diagram of the differential circuit 110B. In the differential circuit 110B, like in the differential circuit 110A, each of the transistor 111 to the transistor 115 includes a back gate. Note that, in the differential circuit 110B, the back gate of the transistor 111 is electrically connected to a terminal Vbg1, the back gate of the transistor 112 is electrically connected to a terminal Vbg2, the back gate of the transistor 113 is electrically connected to a terminal Vbg3, the back gate of the transistor 114 is electrically connected to a terminal Vbg4, and the back gate of the transistor 115 is electrically connected to a terminal Vbg5.

The potential of the back gate may be the same as the potential of the gate, may be a ground potential (GND potential), or may be a given potential. By changing the potential of the back gate with no linkage between the potential of the gate and the potential of the back gate, the threshold voltage of the transistor can be changed.

In addition, the gate and the back gate are formed using conductor and thus also have a function of preventing an electric field generated outside the transistor from affecting the semiconductor in which a channel is formed (particularly, a function of preventing static electricity). That is, a variation in the electrical characteristics of the transistor due to the influence of an external electric field such as static electricity can be prevented. By providing the back gate, operation of the semiconductor device is stabilized and the reliability of the semiconductor device can be increased.

In the differential circuit 110C shown in FIG. 4A, the gate and the back gate are electrically connected to each other in each of the transistor 111, the transistor 112, and the transistor 115. The back gate of the transistor 113 is electrically connected to the terminal Vbg3, and the back gate of the transistor 114 is electrically connected to the terminal Vbg4.

In the differential circuit 110D shown in FIG. 4B, the gate and the back gate are electrically connected to each other in each of the transistor 111 to the transistor 113, and the transistor 115. The back gate of the transistor 114 is electrically connected to the terminal Vbg4.

Figure 5:
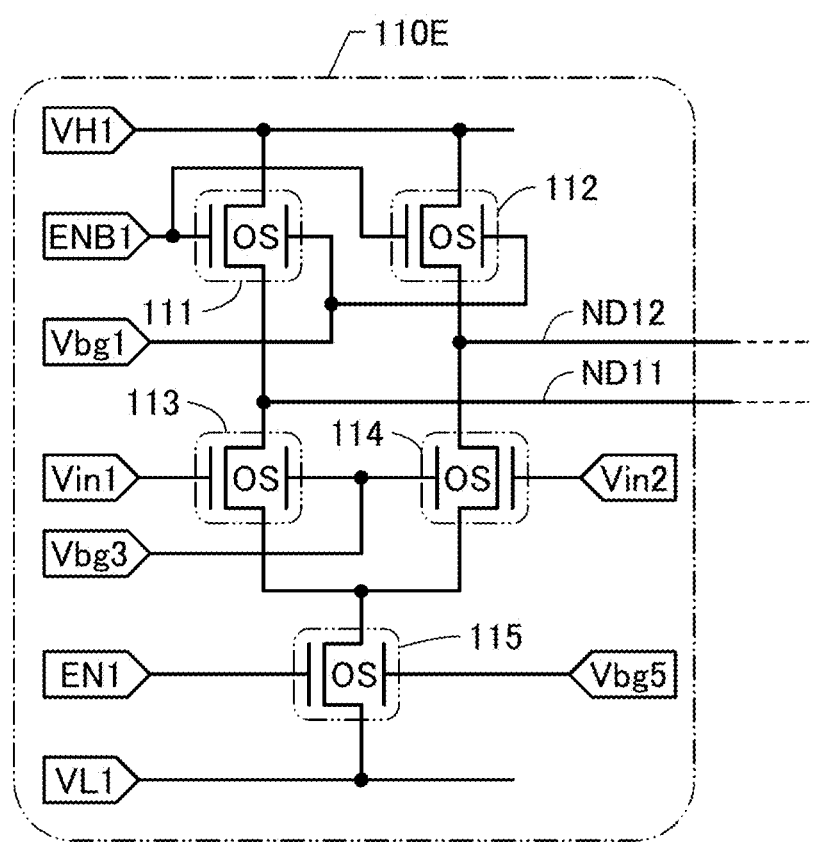
FIG. 5 is a circuit diagram of one embodiment of the present invention.

In the differential circuit 110E shown in FIG. 5, the back gate of the transistor 111 and the back gate of the transistor 112 are electrically connected to the terminal Vbg1. The back gate of the transistor 113 and the back gate of the transistor 114 are electrically connected to the terminal Vbg3.

The connection destinations of the back gates and the potentials supplied to the back gates can be determined arbitrarily depending on the purpose, application and/or the like.

The differential circuit 110A to the differential circuit 110E are modification examples of the differential circuit 110; therefore, any one of the differential circuit 110A to the differential circuit 110E can be used instead of the differential circuit 110.

Modification Example 3

Figure 6A:
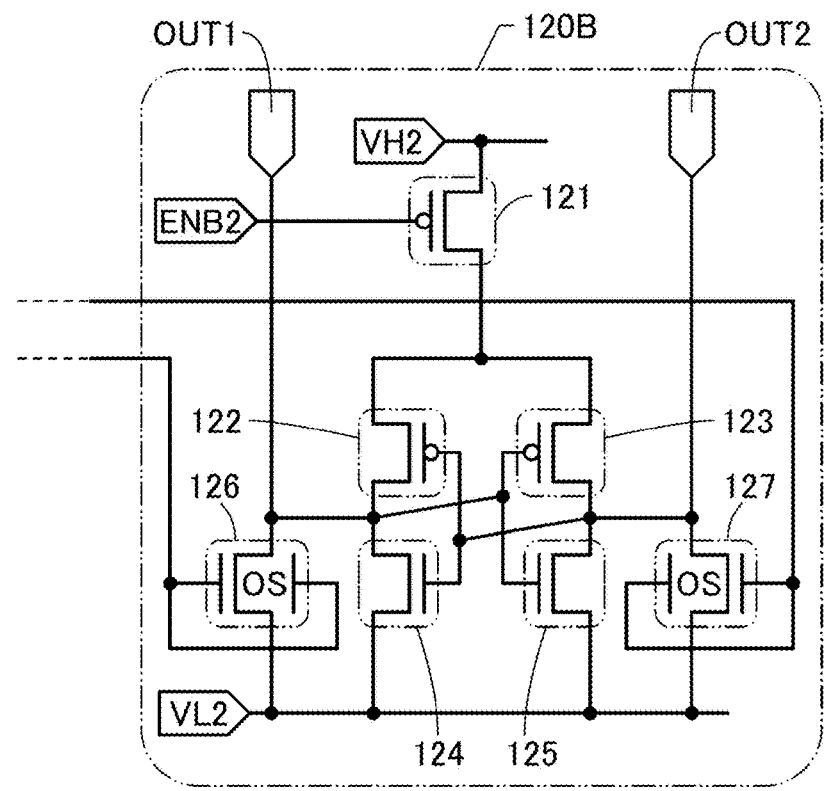
FIG. 6A and FIG. 6B are each a circuit diagram of one embodiment of the present invention.
Figure 6B:
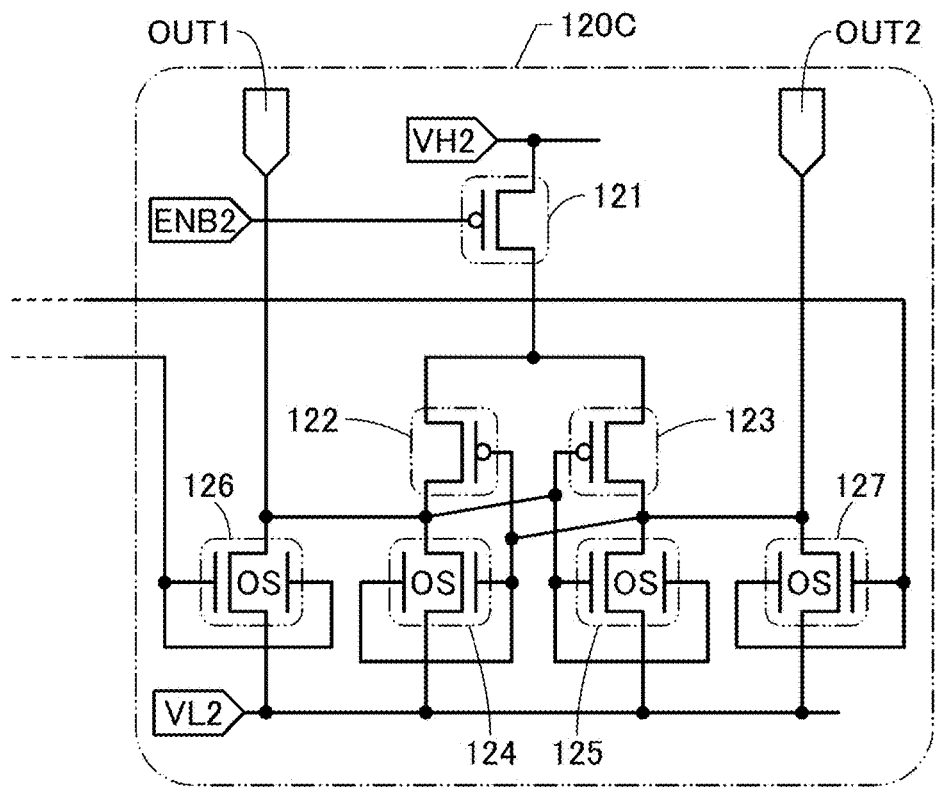

FIG. 6A shows a circuit diagram of the latch circuit 120B. FIG. 6B shows a circuit diagram of the latch circuit 120C. The latch circuit 120B and the latch circuit 120C are modification examples of the latch circuit 120A and therefore are also modification examples of the latch circuit 120. Thus, differences from the latch circuit 120 and the latch circuit 120A are mainly described here.

The latch circuit 120B shows an example in which a transistor having a back gate is used as each of the transistor 126 and the transistor 127. In the latch circuit 120B shown in FIG. 6A, an example in which the gate and the back gate are electrically connected to each other in each of the transistor 126 and the transistor 127 is shown. Note that, as described above, the back gate is not necessarily electrically connected to the gate and may be electrically connected to a terminal supplying a potential to the back gate.

The latch circuit 120C has a structure in which the transistor 124 and the transistor 125 of the latch circuit 120B are replaced with OS transistors having back gates. In the latch circuit 120C shown in FIG. 6B, an example in which the gate and the back gate are electrically connected to each other in each of the transistor 126 and the transistor 127 is shown. Note that the back gate may be electrically connected to a terminal other than the gate. For example, the back gate may be electrically connected to a terminal supplying a potential to the back gate.

Figure 7A:
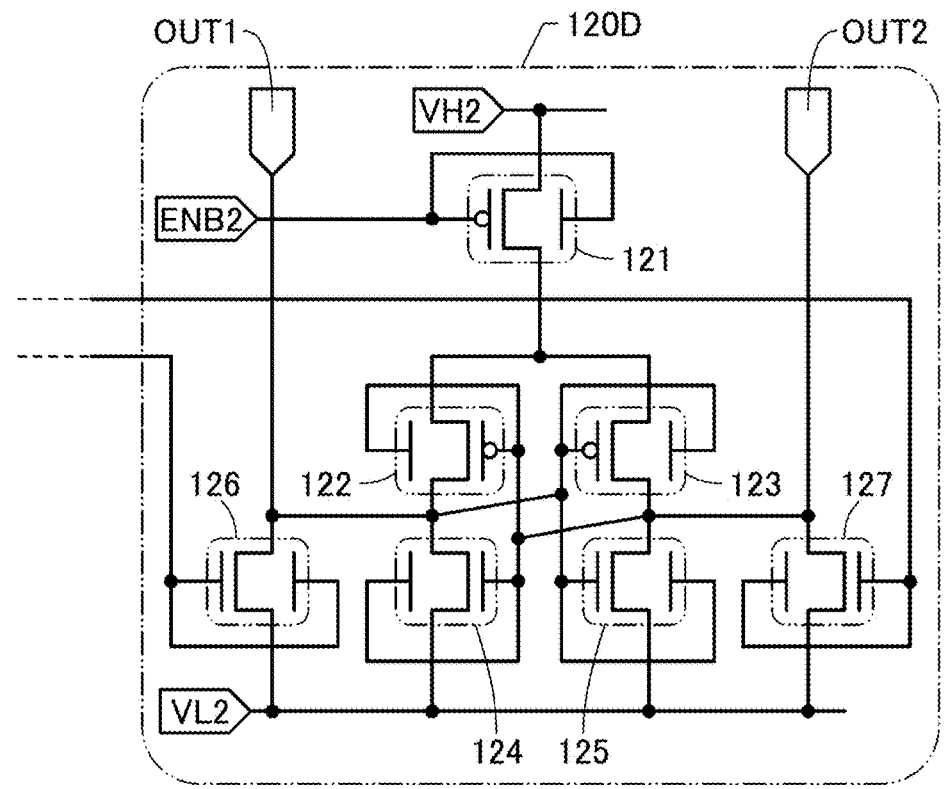
FIG. 7A and FIG. 7B are each a circuit diagram of one embodiment of the present invention.
Figure 7B:
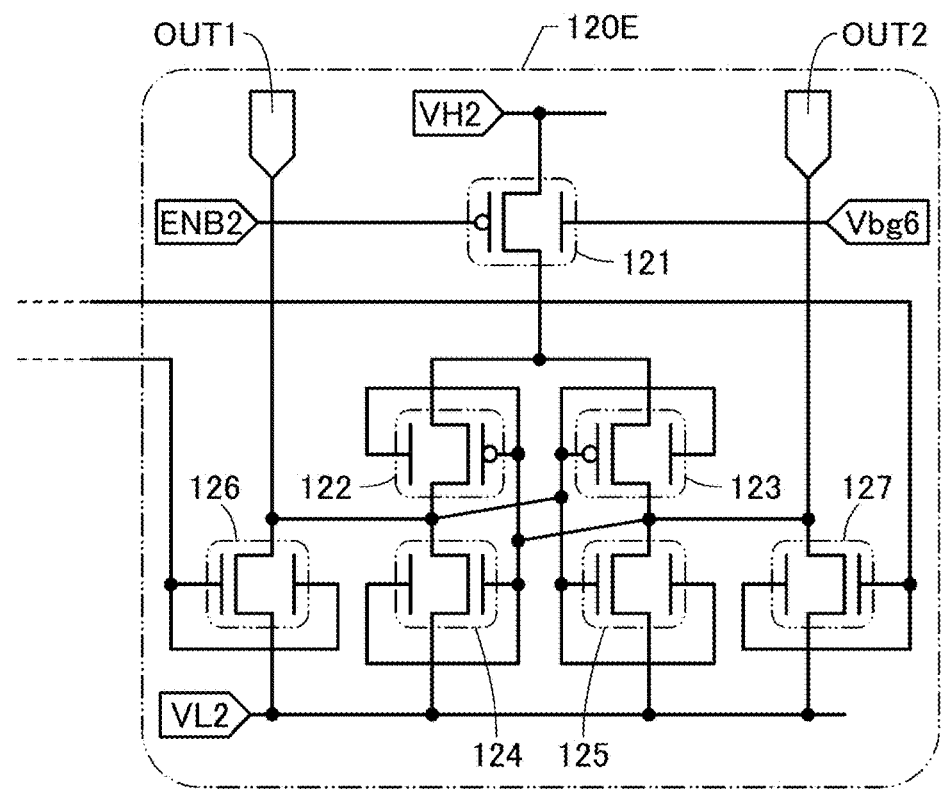

As in the latch circuit 120D shown in FIG. 7A, a transistor having a back gate may be used as each of the transistor 121 to the transistor 127. In the latch circuit 120D, an example in which the gate and the back gate are electrically connected to each other in each of the transistor 121 to the transistor 127 is shown. In the latch circuit 120E shown in FIG. 7B, an example in which the back gate of the transistor 121 is electrically connected to a terminal Vbg6 is shown.

Also in the transistor 122 to the transistor 127, the back gate may be electrically connected to a terminal which is not shown.

The latch circuit 120A to the latch circuit 120E are modification examples of the latch circuit 120; therefore, any one of the latch circuit 120A to the latch circuit 120E can be used instead of the latch circuit 120.

<Operation Example of Semiconductor Device 100>

A semiconductor device of one embodiment of the present invention can convert a variety of analog signals into a binary or multilevel digital signal (also referred to as "AD conversion"). The semiconductor device can be used for the AD conversion of a variety of analog signals; for example, imaging data obtained by an imaging device including an image sensor or the like, acoustic data obtained by a sound collecting device including a microphone or the like, illuminance data obtained by a light-receiving device including an optical sensor or the like, temperature data obtained by a temperature measuring device including a temperature sensor or the like, and humidity data obtained by a humidity measuring device including a humidity sensor or the like.

Figure 8:
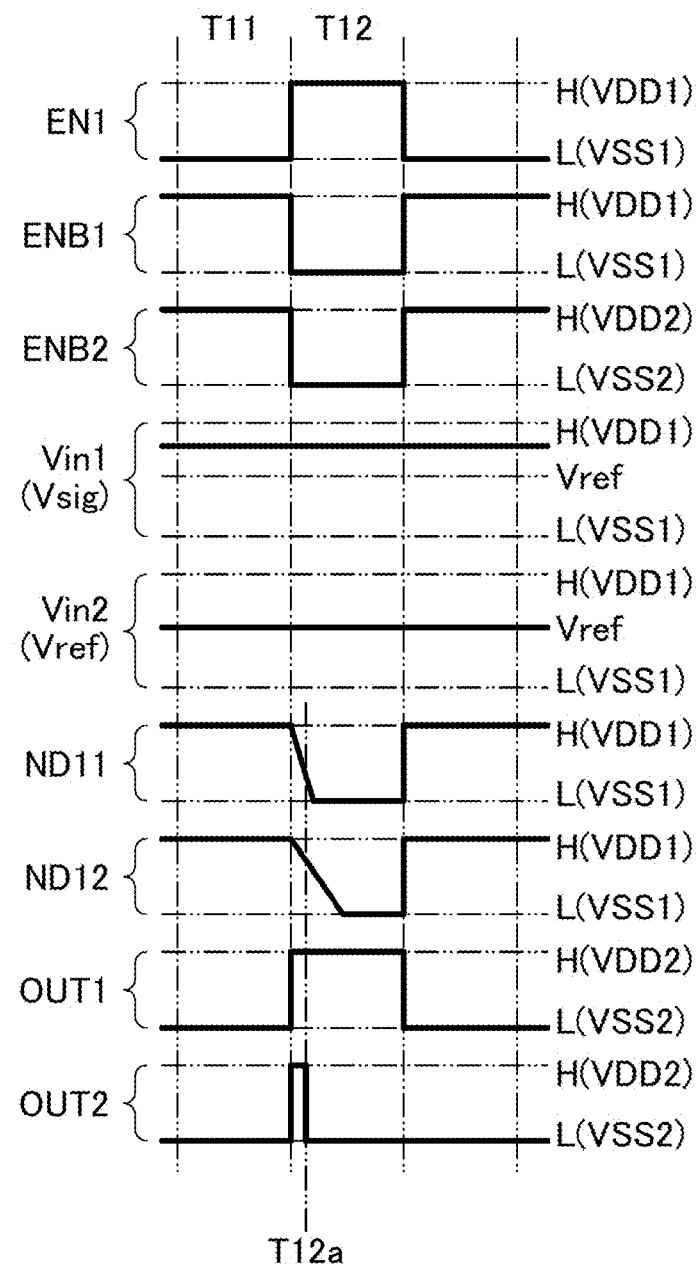
FIG. 8 is a timing chart showing an operation example of a semiconductor device.

An operation example of the semiconductor device 100 will be described with reference to drawings. FIG. 8 is a timing chart showing operation of the semiconductor device 100, and FIG. 9 and FIG. 10 are circuit diagrams each showing an operation state of the semiconductor device 100.

[Binarization of Analog Signal (Binary AD Conversion)]

An operation example of binarization (conversion into 1 bit) of an analog signal using the semiconductor device 100 of one embodiment of the present invention is described. The binarization of an analog signal can be performed by determining whether the potential of the analog signal (a potential Vsig) input to the semiconductor device 100 is higher or lower than the reference potential (a potential Vref).

In this embodiment, description is made on a case where the potential Vsig which is a potential of an analog signal is supplied to the terminal Vin1 of the semiconductor device 100 and the potential Vref which is a reference potential is supplied to the terminal Vin2. Note that the potential Vsig is higher than the threshold voltage of the transistor 113, and the potential Vref is higher than the threshold voltage of the transistor 114. In this embodiment, the case where the potential Vsig supplied to the terminal Vin1 is higher than the potential Vref is described.

A high power supply potential VDD1 is supplied to the terminal VH1, the low power supply potential VSS1 is supplied to the terminal VL1, the high power supply potential VDD2 is supplied to the terminal VH2, and the low power supply potential VSS2 is supplied to the terminal VL2. Furthermore, each of the high power supply potential VDD1 and the high power supply potential VDD2 is referred to as the potential H, and each of the low power supply potential VSS1 and the low power supply potential VSS2 is referred to as the potential L in some cases.

Figure 9A:
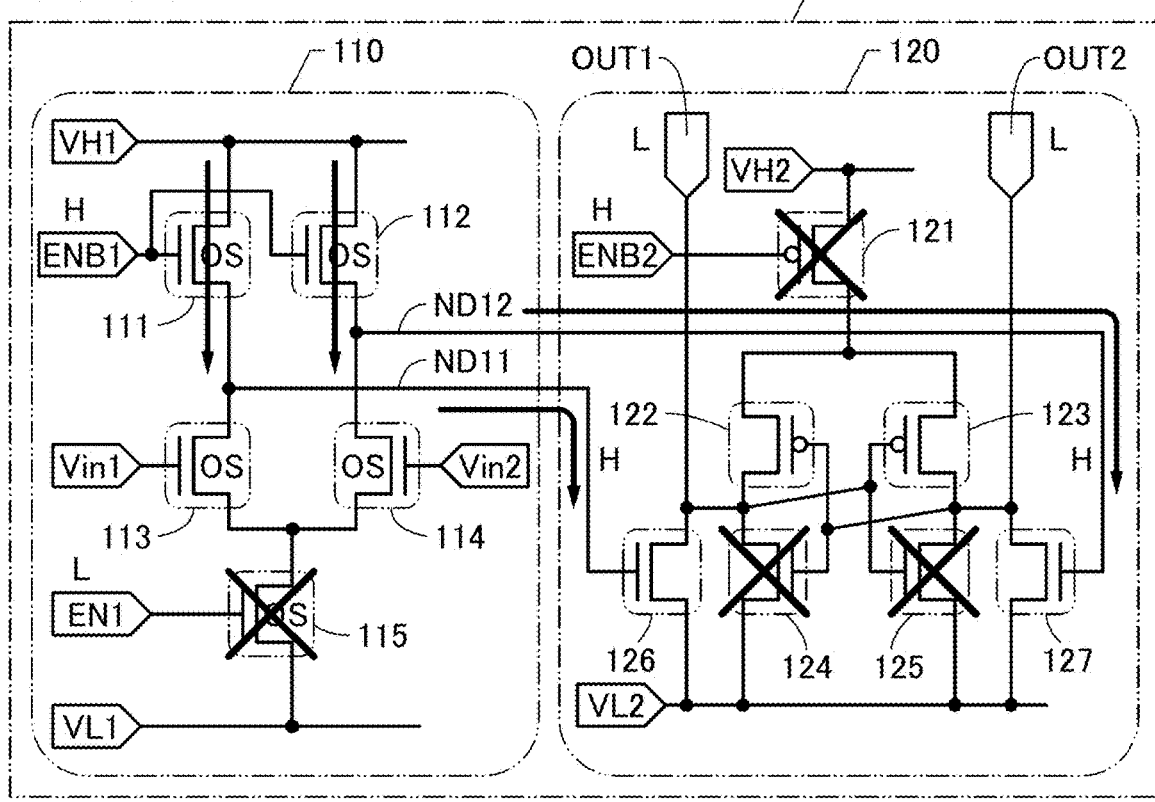
FIG. 9A and FIG. 9B are diagrams each showing an operation example of a semiconductor device.
Figure 10:
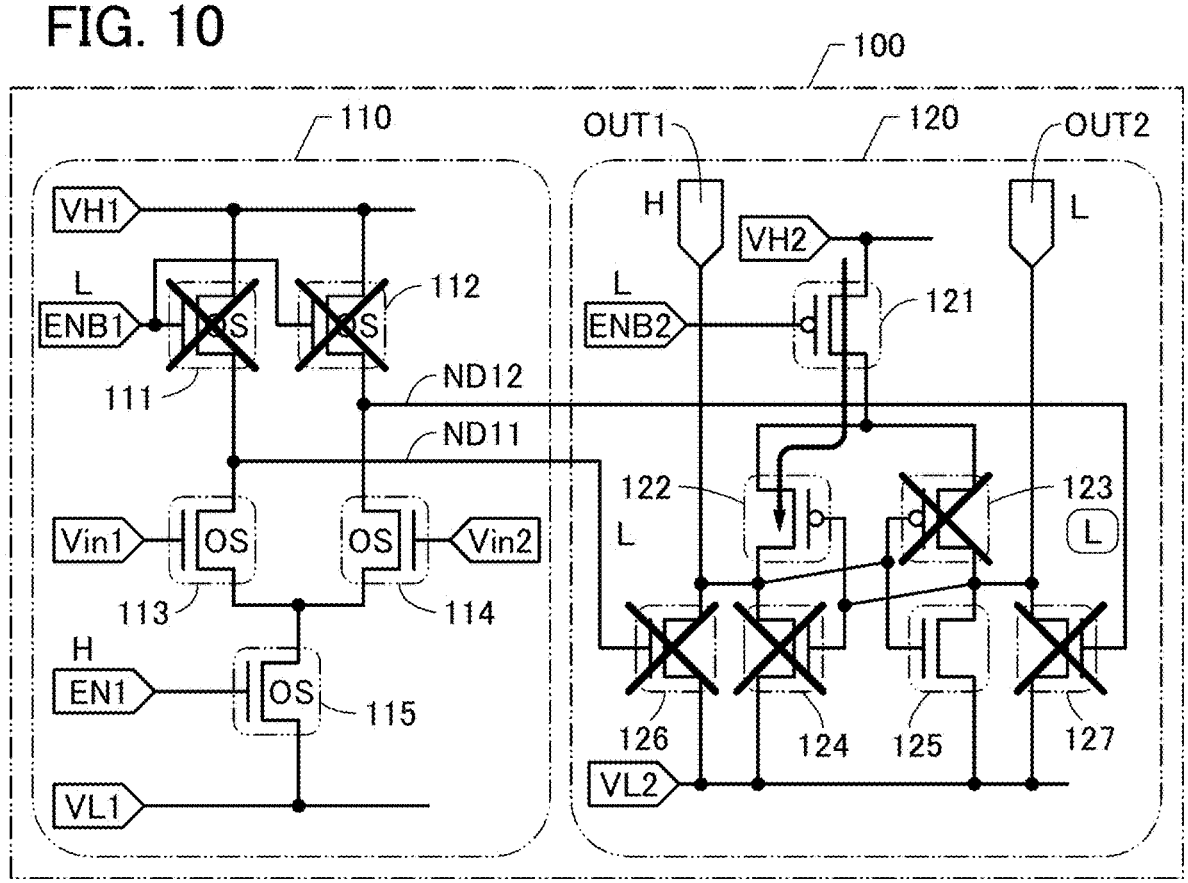
FIG. 10 is a diagram showing an operation example of a semiconductor device.

In a period T11, the potential L (the low power supply potential VSS1) is supplied to the terminal EN1, and the potential H (the high power supply potential VDD1) is supplied to the terminal ENB1 (see FIG. 8 and FIG. 9A). In addition, the potential H (the high power supply potential VDD2) is supplied to the terminal ENB2. Accordingly, the transistor 111 to the transistor 114 are turned on and the transistor 115 is turned off. Moreover, the potential H (the high power supply potential VDD1) is supplied to each of the node ND11 and the node ND12. The transistor 121 is turned off.

In addition, the potential H is supplied to each of the node ND11 and the node ND12, whereby the transistor 126 and the transistor 127 are turned on. When the transistor 126 is turned on, the potential L (the low power supply potential VSS2) is supplied to the terminal OUT1, and the transistor 123 which is a p-channel transistor is turned on. Similarly, when the transistor 127 is turned on, the potential L (the low power supply potential VSS2) is supplied to the terminal OUT2, whereby the transistor 122 which is a p-channel transistor is turned on. Note that the period T11 is also referred to as "precharge period".

In a period T12, the potential H (the high power supply potential VDD1) is supplied to the terminal EN1, the potential L (the low power supply potential VSS1) is supplied to the terminal ENB1, and the potential L (the low power supply potential VSS2) is supplied to the terminal ENB2.

Figure 9B:
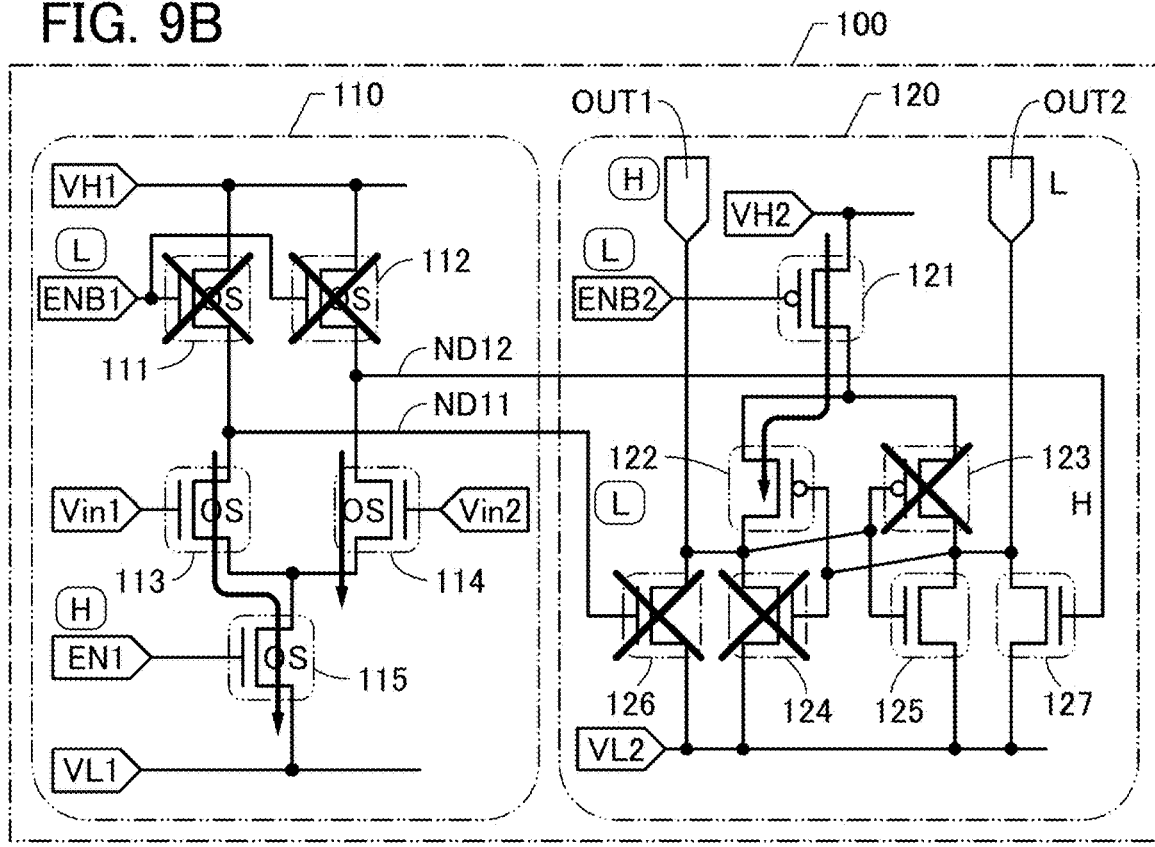

FIG. 9B is a circuit diagram showing a state of the semiconductor device 100 at a time T12a, immediately after the period T12. At the time T12a, the transistor 111 and the transistor 112 are in an off state, and the transistor 113 to the transistor 115 are in an on state. In addition, the transistor 121 is in an on state, and the transistor 122 and the transistor 123 remain in an on state.

Furthermore, the node ND11 and the terminal VL1 are brought into a conduction state through the transistor 113 and the transistor 115. Similarly, the node ND12 and the terminal VL1 are brought into a conduction state through the transistor 114 and the transistor 115. Thus, the potentials of the node ND11 and the node ND12 change from the potential H to the potential L.

The potential of the analog signal supplied to the terminal Vin1 is higher (larger) than the potential Vref supplied to the terminal Vin2. Accordingly, the on-state current of the transistor 113 is larger than that of the transistor 114. Thus, the potential change of the node ND11 is faster than that of the node ND12, whereby the transistor 126 is turned off earlier than the transistor 127.

When the transistor 126 is turned off, the terminal OUT1 and the terminal VL2 are brought into a non-conduction state. Electrical continuity between the terminal OUT1 and the terminal VH2 is established through the transistor 121 and the transistor 122, whereby the potential H is supplied. Furthermore, the transistor 123 is turned off and the transistor 125 is turned on. Note that FIG. 9B shows a state immediately after the transistor 126 is turned off.

After that, the potential of the node ND12 also becomes the potential L, and the transistor 127 is turned off (see FIG. 10). Note that in the case where the potential of the analog signal supplied to the terminal Vin1 is lower (smaller) than the potential Vref, the potential L is supplied to the terminal OUT1 and the potential H is supplied to the terminal OUT2. In this manner, the analog signal can be binarized.

In the case where the potential of the analog signal input to the differential circuit 110 is high (the voltage is high), a transistor having a high withstand voltage is preferably used as a transistor included in the differential circuit 110. As described above, an OS transistor has a high withstand voltage, and thus, the OS transistor is suitable for each of the transistor 111 to the transistor 115. In the case where the voltage of the analog signal input to the differential circuit 110 is high, it is preferable that the power supply voltage be increased in the differential circuit 110.

In addition, the potentials of the node ND11 and the node ND12 can be changed quickly by increasing the power supply voltage for the differential circuit 110. Consequently, the operating speed of the semiconductor device 100 can be increased.

In the latch circuit 120, it is only required that 1-bit (binary data) output is obtained. Accordingly, the power supply voltage for the latch circuit 120 may be lower than or equal to that of the differential circuit 110. When the power supply voltages of the differential circuit 110 and the latch circuit 120 are different form each other, the power consumption of the semiconductor device 100 can be reduced. In addition, an increase in operation speed and a reduction in power consumption of the semiconductor device 100 can be achieved.

[Conversion into Multilevel Analog Signal (Multilevel AD Conversion)]

Next, an operation example of converting an analog signal into a multilevel signal using the semiconductor device 100 of one embodiment of the present invention is described with reference to drawings.

Figure 11A:
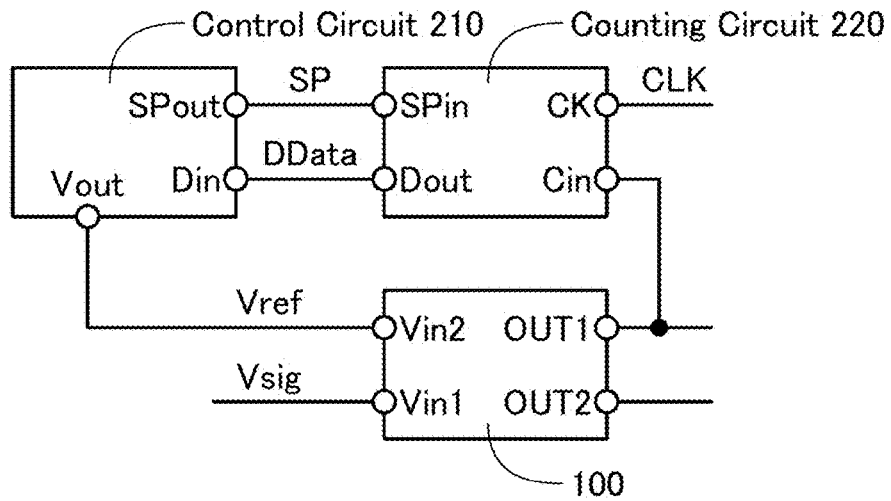
FIG. 11A is a block diagram showing a structure example of a semiconductor device.
Figure 11B:
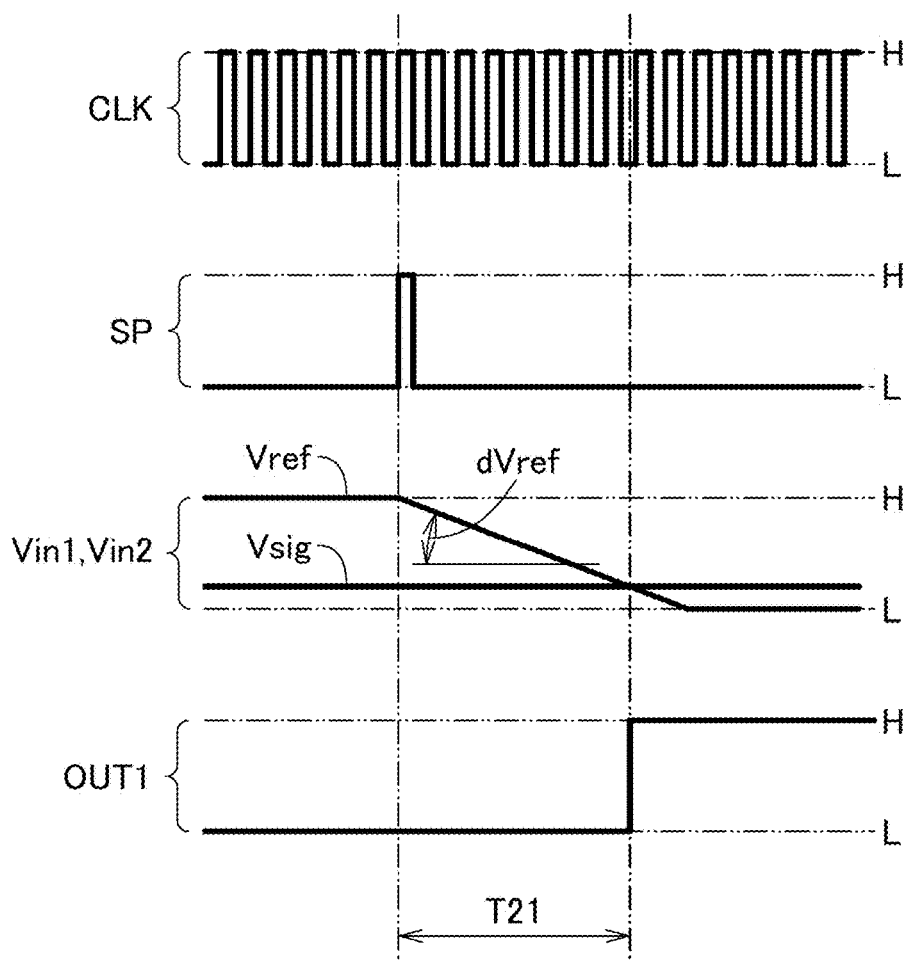
FIG. 11B is a timing chart showing an operation example of a semiconductor device.

FIG. 11A is a block diagram showing a structure example of an AD conversion circuit 200. FIG. 11B is a timing chart showing an example of multilevel AD conversion. Note that the AD conversion circuit 200 is also a kind of a semiconductor device.

The AD conversion circuit 200 includes a control circuit 210, a counting circuit 220, and the semiconductor device 100. The control circuit 210 includes a terminal SPout, a terminal Din, and a terminal Vout. Note that the control circuit 210 may include a terminal other than these terminals. The counting circuit 220 includes a terminal SPin, a terminal Dout, a terminal CK, and a terminal Cin. Note that the counting circuit 220 may include a terminal other than these terminals. The semiconductor device 100 may include a terminal other than the terminal Vin1, the terminal Vin2, the terminal OUT1, and the terminal OUT2.

The terminal Vout and the terminal Vin2 are electrically connected to each other. The terminal SPout is electrically connected to the terminal SPin. The terminal Din is electrically connected to the terminal Dout. The terminal Cin is electrically connected to the terminal OUT1.

The control circuit 210 has a function of outputting a start pulse signal SP from the terminal SPout. The start pulse signal SP is supplied to the terminal SPin included in the counting circuit 220. In addition, the control circuit 210 has a function of outputting the reference potential Vref from the terminal Vout. The reference potential Vref is supplied to the terminal Vin2 included in the semiconductor device 100.

A clock signal CLK is supplied to the terminal CK of the counting circuit 220. In addition, the potential Vsig which is an analog signal is supplied to the terminal Vin1. In this embodiment, the reference potential Vref is set to the potential H in an initial state before AD conversion. Furthermore, the potential Vsig is lower than the reference potential Vref. Thus, the potential of the terminal OUT1 is the potential L.

The control circuit 210 supplies the start pulse signal SP to the counting circuit 220 and slowly changes the potential of the reference potential Vref from the potential H to the potential L. That is, a slop signal is supplied as the reference potential Vref.

When the potential of the reference potential Vref becomes lower than the potential Vsig, the potential of the terminal OUT1 changes from the potential L to the potential H. The counting circuit 220 counts the number of clocks (the number of rises or the number of falls of the clock signal CLK) in the period (a period T21) from the input of the start pulse SP to the change of the potential of the terminal Cin from the potential L to the potential H. The number of clocks becomes larger as the potential difference between the potential Vsig and the reference potential Vref is larger. In this manner, the potential Vsig which is an analog signal can be replaced with digital data DData (the number of clocks in the period T21). The digital data DData obtained in the counting circuit 220 is supplied to the terminal Din in the control circuit 210 through the terminal Dout.

The accuracy of the AD conversion can be increased by increasing the frequency of the clock signal CLK, by decreasing a changing rate dVref (the amount of change of the potential Vref per unit time) of the potential Vref in the period T21, or by conducting both of them.

The accuracy of the AD conversion can be increased also by increasing the potential difference between the potential H (the high power supply potential VDD1) and the potential L (the low power supply potential VSS1) in the differential circuit 110 without changing the frequency of the clock signal CLK and the changing rate dVref.

In addition, the time needed for the AD conversion can be reduced without a decrease in accuracy by increasing the frequency of the clock signal CLK and the power supply voltage of the differential circuit 110. In other words, the AD conversion speed can be increased.

The AD conversion accuracy and/or the AD conversion speed can be increased by increasing the power supply voltage of the differential circuit 110. Thus, the OS transistor is preferably used as at least part of the transistors included in the semiconductor device 100.

As described above, the power supply voltage for the latch circuit 120 may be lower than or equal to that of the differential circuit 110. When the power supply voltages of the differential circuit 110 and the latch circuit 120 are different form each other, an increase in unneeded power consumption of the semiconductor device 100 can be reduced. Moreover, the power consumption of the semiconductor device 100 can be reduced.

Figure 12A:
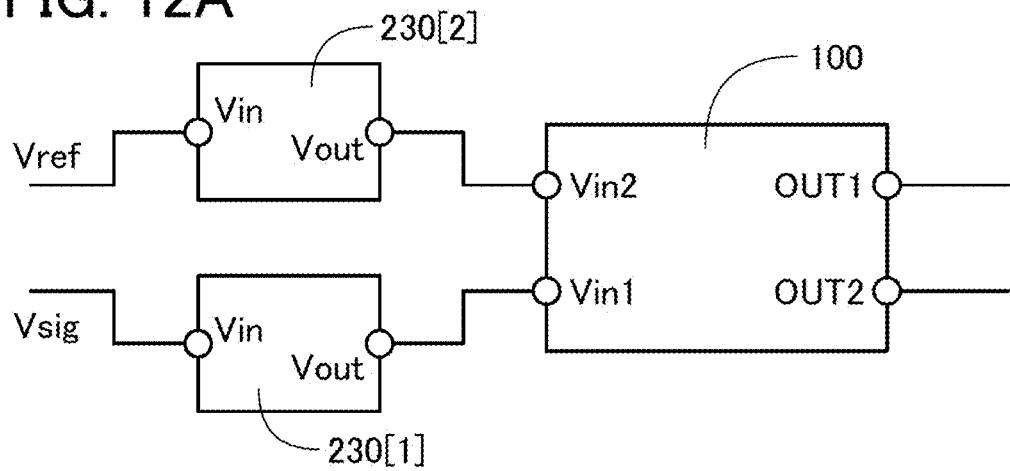
FIG. 12A to FIG. 12C are diagrams each showing a structure example of a semiconductor device.

As shown in FIG. 12A, a sample-and-hold circuit 230[1] may be provided in front of the terminal Vin1 of the semiconductor device 100 and a sample-and-hold circuit 230[2] may be provided in front of the terminal Vin2. The sample-and-hold circuit 230 (the sample-and-hold circuit 230[1] and the sample-and-hold circuit 230[2]) includes a terminal Vin and the terminal Vout and has a function of holding a potential supplied from the terminal Vin and a function of outputting the potential from the terminal Vout.

Figure 12B:
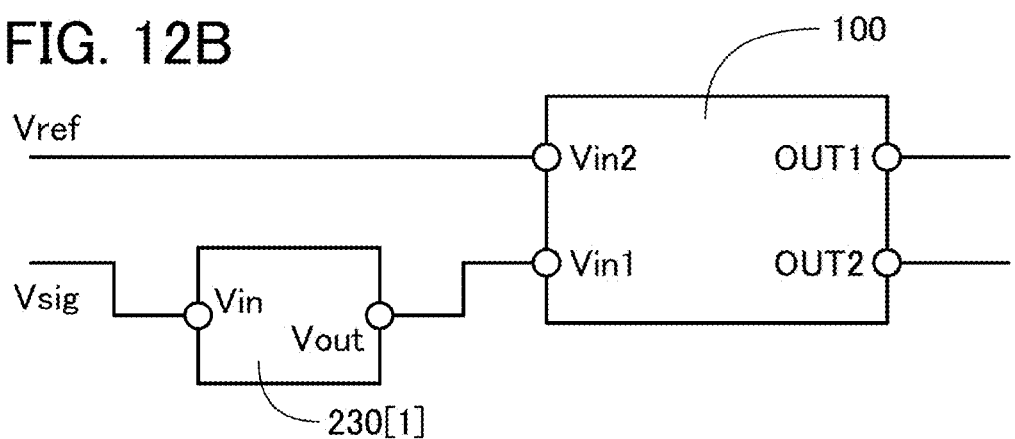
Figure 12C:
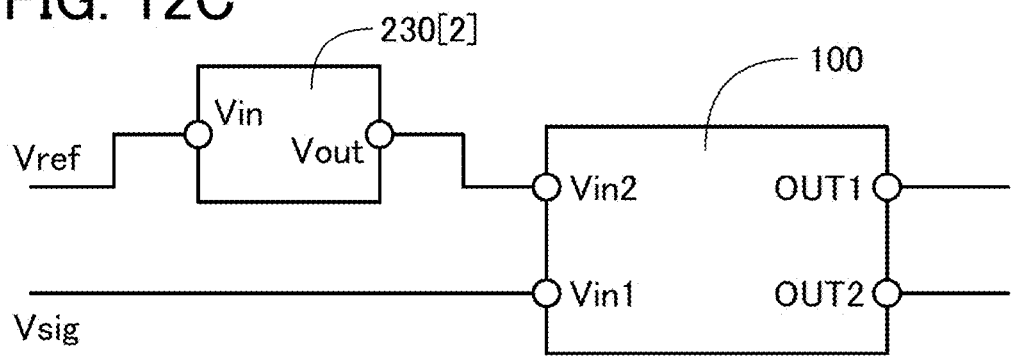

Only one of the sample-and-hold circuit 230[1] and the sample-and-hold circuit 230[2] may be provided. It is possible to employ a structure in which the sample-and-hold circuit 230[1] is provided in front of the terminal Vin1 of the semiconductor device 100 and the sample-and-hold circuit 230[2] is not provided in front of the terminal Vin2 as shown in FIG. 12B. It is possible to employ a structure in which the sample-and-hold circuit 230[2] is provided in front of the terminal Vin2 of the semiconductor device 100 and the sample-and-hold circuit 230[1] is not provided in front of the terminal Vin2 as shown in FIG. 12C.

By holding the potential Vsig and/or the potential Vref using the sample-and-hold circuit 230, the potential Vsig and/or the potential Vref need not be continuously supplied to the semiconductor device 100. Thus, the power consumption of the AD conversion circuit 200 can be reduced.

For example, in the case where the AD conversion circuit 200 includes a plurality of semiconductor devices 100 and one control circuit 210 controls the plurality of semiconductor devices 100, while AD conversion is performed using one semiconductor device 100, the control circuit 210 can supply the potential Vref and the potential Vsig to another semiconductor device 100. In this manner, operation efficiency of the AD conversion circuit 200 can be increased by using the sample-and-hold circuit 230. Furthermore, the operation speed of the AD conversion circuit 200 can be increased.

FIG. 13A to FIG. 13D show circuit structure examples that can be used for the sample-and-hold circuit 230.

Figure 13A:
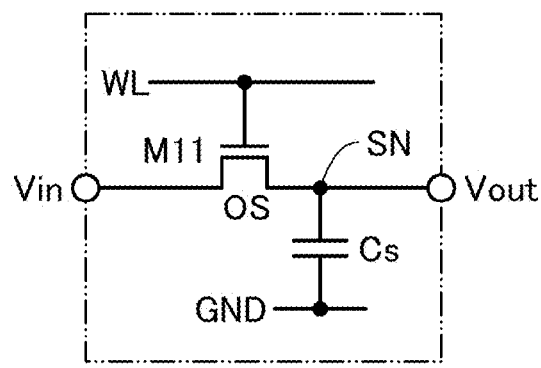
FIG. 13A to FIG. 13D are diagrams each showing a structure example of a sample-and-hold circuit.

FIG. 13A shows a circuit structure example of a sample-and-hold circuit 230a including one transistor and one capacitor (also referred to as "1Tr1C type"). The sample-and-hold circuit 230a includes a transistor M11 and a capacitor Cs. One of a source and a drain of the transistor M11 is electrically connected to the terminal Vin. The other of the source and the drain of the transistor M11 is electrically connected to one electrode of the capacitor Cs and the terminal Vout. The other electrode of the capacitor Cs is electrically connected to a wiring GND. A gate of the transistor M11 is electrically connected to a wiring WL. A node where the other of the source and the drain of the transistor M11, the one electrode of the capacitor Cs, and the terminal Vout are electrically connected functions as a storage node SN.

Data writing is performed by applying the potential H to the wiring WL to turn on the transistor M11 so that the terminal Vin and the node SN are electrically connected to each other. After the data writing, the potential L is applied to the wiring WL to turn off the transistor M11 so that data written to the storage node SN is held. For example, a fixed potential such as a ground potential, VDD (e.g., VDD1 and VDD2), or VSS (e.g., VSS1 and VSS2) is preferably supplied to the wiring GND. Note that the fixed potential may be a potential other than these potentials.

An OS transistor is preferably used as the transistor M11. Moreover, the transistor M11 may include a back gate. The use of the OS transistor as the transistor M11 enables the leakage current of the transistor M11 to be extremely low because the OS transistor has extremely low off-state current (leakage current). In other words, data written to the storage node SN can be held for a long time.

Figure 13B:
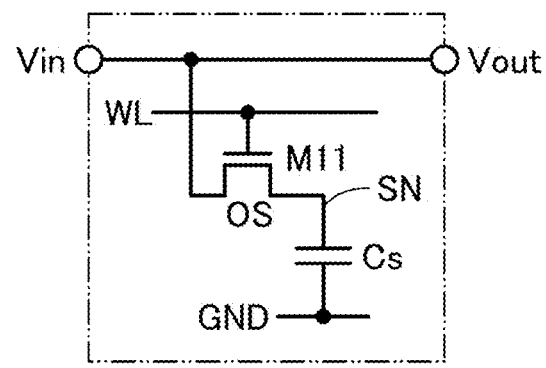

FIG. 13B shows a circuit structure example of the sample-and-hold circuit 230b. The sample-and-hold circuit 230b is a modification example of the sample-and-hold circuit 230a and is a kind of 1Tr1C type sample-and-hold circuit. The sample-and-hold circuit 230b includes the transistor M11 and the capacitor Cs. The one of the source and the drain of the transistor M11 is electrically connected to the terminal Vin and the terminal Vout. The other of the source and the drain of the transistor M11 is electrically connected to the one electrode of the capacitor Cs. The other electrode of the capacitor Cs is electrically connected to the wiring GND. The gate of the transistor M11 is electrically connected to the wiring WL. A node where the other of the source and the drain of the transistor M11 and the one electrode of the capacitor Cs are electrically connected functions as the storage node SN.

As in the sample-and-hold circuit 230a, a fixed potential is preferably supplied to the wiring GND. Data writing and reading are performed by applying the potential H to the wiring WL to turn on the transistor M11 so that the terminal Vin and the node SN are electrically connected to each other. An OS transistor is preferably used as the transistor M11 also in the sample-and-hold circuit 230b.

Figure 13C:
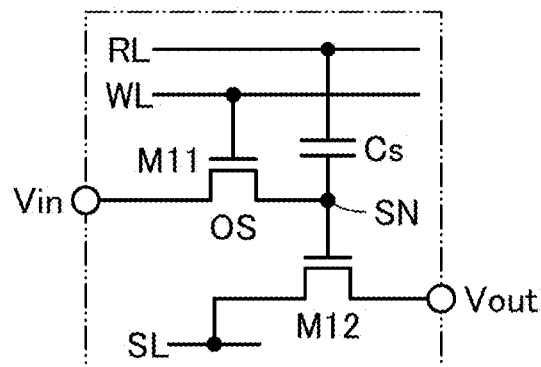

FIG. 13C shows a circuit structure example of a gain cell type (also referred to as "2Tr1C type") sample-and-hold circuit 230c including two transistors and one capacitor. The sample-and-hold circuit 230c includes the transistor M11, a transistor M12, and the capacitor Cs.

The one of the source and the drain of the transistor M11 is electrically connected to the terminal Vin, the other of the source and the drain of the transistor M11 is electrically connected to the one electrode of the capacitor Cs, and the gate of the transistor M11 is electrically connected to the wiring WL. The other electrode of the capacitor Cs is electrically connected to a wiring RL. One of a source and a drain of the transistor M12 is electrically connected to a wiring SL, the other of the source and the drain of the transistor M12 is electrically connected to the terminal Vout, and a gate of the transistor M12 is electrically connected to the one electrode of the capacitor Cs. A node where the other of the source and the drain of the transistor M11, the one electrode of the capacitor Cs, and the gate of the transistor M11 are electrically connected functions as the storage node SN.

Data writing is performed by applying the potential H to the wiring WL to turn on the transistor M11 so that the terminal Vin and the storage node SN are in a conduction state. After that, the potential L is applied to the wiring WL to turn off the transistor M11 so that the electric charge supplied to the storage node SN is held. An OS transistor is preferably used as the transistor M11 also in the sample-and-hold circuit 230c.

Data reading is performed by applying a predetermined potential to each of the wiring RL and the wiring SL. The current flowing between the source and the drain of the transistor M12 and the potential of the terminal Vout depend on the potentials of the wiring SL, the storage node SN, and the gate of the transistor M12. The high power supply potential VDD1, for example, is supplied to the wiring SL. When the potential for reading (e.g., a potential higher than or equal to the threshold of the transistor M12) is supplied to the wiring RL, a voltage according to the amount of the electric charge held at the storage node SN is supplied to the terminal Vout.

Figure 13D:
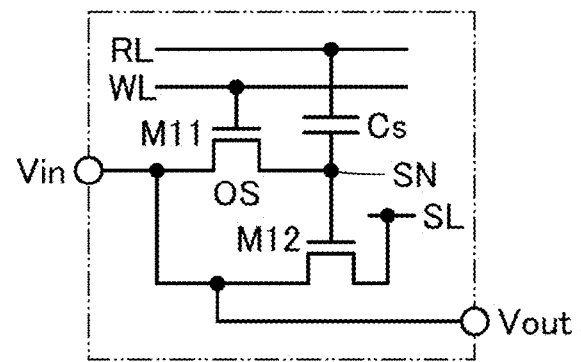

A sample-and-hold circuit 230d shown in FIG. 13D is a modification example of the sample-and-hold circuit 230c. In the sample-and-hold circuit 230d, the other of the source and the drain of the transistor M12 is electrically connected to the terminal Vin and the terminal Vout. The sample-and-hold circuit 230d can also operate in a manner similar to that of the sample-and-hold circuit 230c.

In the sample-and-hold circuit 230d, while a potential is supplied to the terminal Vin, the same potential is supplied to the terminal Vin and the terminal Vout. After the supply of the potential to the terminal Vin stops, a potential corresponding to the storage node SN can be supplied to the terminal Vout.

The sample-and-hold circuit 230 (the sample-and-hold circuit 230a, the sample-and-hold circuit 230b, the sample-and-hold circuit 230c, and the sample-and-hold circuit 230d) functions as a memory circuit. A memory circuit including an OS transistor as at least part of transistors included in the memory circuit is referred to as an "OS memory" in some cases.

The OS memory can hold data written thereto for one year or longer, or ten years or longer even after power supply is stopped. Hence, the OS memory can be regarded as a nonvolatile memory.

In the OS memory, the amount of written electric charge is less likely to change over a long period of time; hence, the OS memory can hold multilevel (multibit) or analog data as well as binary (1-bit) data.

The OS memory employs a method in which electric charge is written to a node through an OS transistor; hence, high voltage, which a conventional flash memory requires, is unnecessary and high-speed writing operation is possible. The OS memory does not require erasing operation before data rewriting, which is performed in a flash memory. Furthermore, the OS memory does not conduct injection and extraction of electric charge to and from a floating gate or a charge-trap layer, substantially allowing an unlimited number of times of data writing and reading. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level during writing operation. Hence, the OS memory has higher rewrite endurance than the magneto-resistive memory and the resistance-change memory.

The off-state current of the OS transistor hardly increases even in a high-temperature environment. Specifically, the off-state current hardly increases even at an environment temperature higher than or equal to room temperature and lower than or equal to 200° C. Furthermore, the on-state current is less likely to decrease even in a high-temperature environment. A memory device including the OS memory achieves stable operation and high reliability even in a high-temperature environment. Moreover, the withstand voltage between the source and the drain of the OS transistor is high. When OS transistors are used as transistors included in a semiconductor device, the semiconductor device achieves stable operation and high reliability even in a high-temperature environment.

The configuration, structure, method, or the like described in this embodiment can be used in combination with the configuration, structure, method, or the like described in the other embodiments and the like as appropriate.

Embodiment 2

In this embodiment, structure examples of transistors that can be used in the semiconductor device described in the above embodiment are described. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Figure 14:
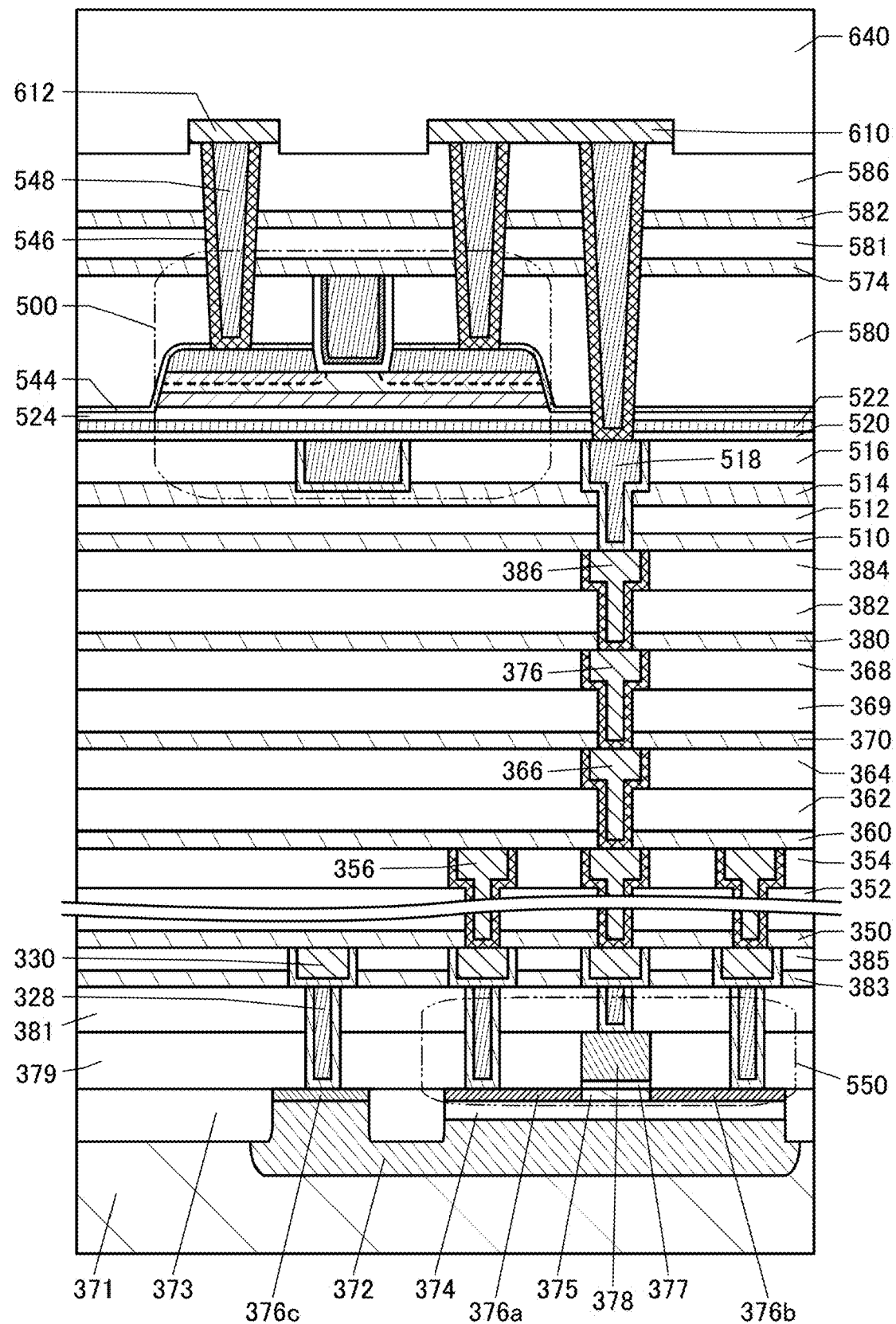
FIG. 14 is a diagram illustrating a structure example of a semiconductor device.
Figure 15A:
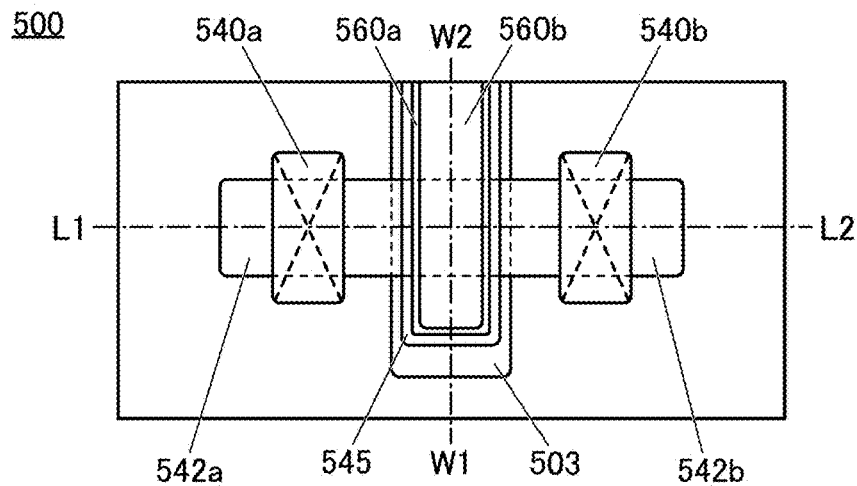
FIG. 15A to FIG. 15C are diagrams illustrating a structure example of a transistor.
Figure 15B:
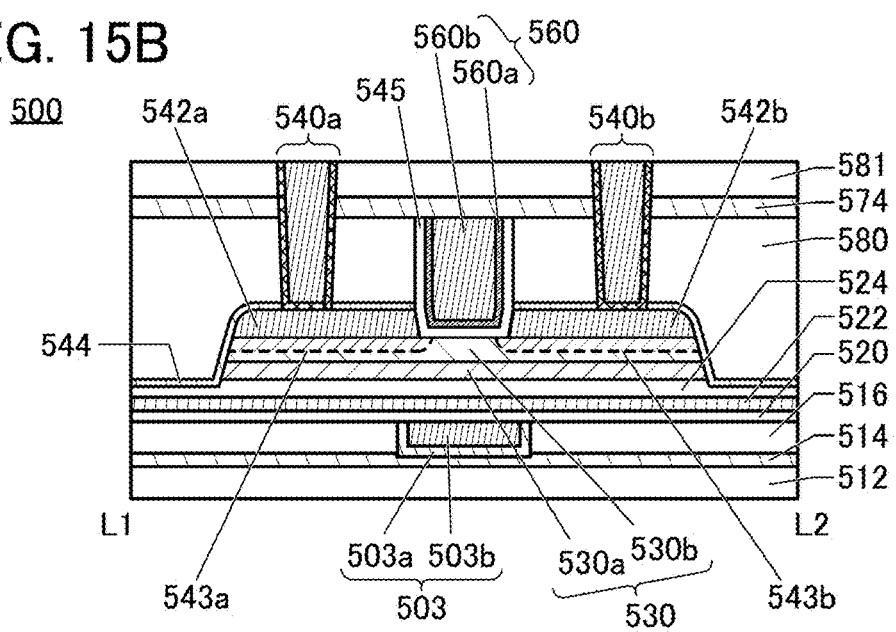
Figure 15C:
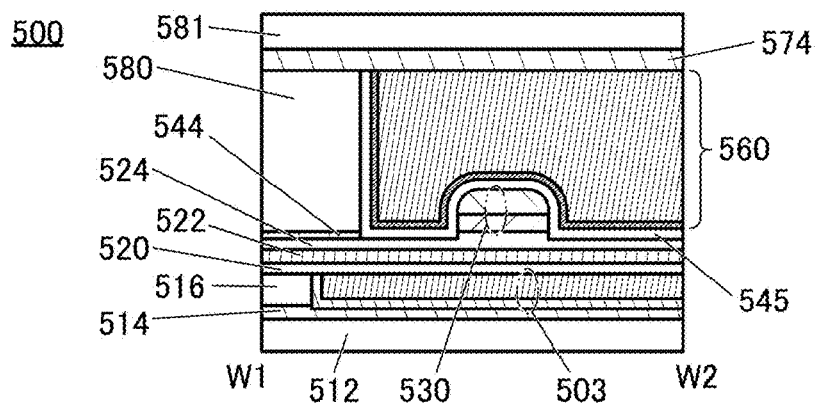

FIG. 14 illustrates part of a cross-sectional structure of a semiconductor device. The semiconductor device illustrated in FIG. 14 includes a transistor 550 and a transistor 500. FIG. 15A is a top view of the transistor 500. FIG. 15B is a cross-sectional view of a portion L1-L2 indicated by a dashed-dotted line in FIG. 15A, and is a cross-sectional view in the channel length direction of the transistor 500. FIG. 15C is a cross-sectional view of a portion W1-W2 indicated by a dashed-dotted line in FIG. 15A, and is a cross-sectional view in the channel width direction of the transistor 500. For example, the transistor 500 corresponds to an OS transistor included in the semiconductor device 100 described in the above embodiment, that is, a transistor including an oxide semiconductor in its channel formation region. The transistor 550 corresponds to a Si transistor included in the latch circuit 120 described in the above embodiment, that is, a transistor including silicon in its channel formation region.

The transistor 500 is an OS transistor. The off-state current of an OS transistor is extremely low. Accordingly, data voltage or electric charge written to a memory node through the transistor 500 can be held for a long time. In other words, power consumption of the semiconductor device can be reduced because the memory node has a low frequency of refresh operation or requires no refresh operation.

In FIG. 14, the transistor 500 is provided above the transistor 550.

The transistor 550 is provided on a substrate 371. The substrate 371 is a p-type silicon substrate, for example. The substrate 371 may be an n-type silicon substrate. An oxide layer 374 is preferably an insulating layer formed with an oxide buried (Burried oxide) into the substrate 371 (the insulating layer is also referred to as a BOX layer), for example, a silicon oxide. The transistor 550 is formed using a single crystal silicon provided over the substrate 371 with the oxide layer 374 sandwiched therebetween; that is, the transistor 550 is provided on an SOI (Silicon On Insulator) substrate.

The substrate 371 included in the SOI substrate is provided with an insulator 373 serving as an element isolation layer. The substrate 371 includes a well region 372. The well region 372 is a region to which n-type or p-type conductivity is imparted in accordance with the conductivity of the transistor 550. The single-crystal silicon in the SOI substrate is provided with a semiconductor region 375 and a low-resistance region 376a and a low-resistance region 376b each of which functions as a source region or a drain region. A low-resistance region 376c is provided over the well region 372.

The transistor 550 can be provided so as to overlap with the well region 372 to which an impurity element imparting conductivity is added. The well region 372 can function as a bottom-gate electrode of the transistor 550 by independently changing the potential through the low-resistance region 376c. Thus, the threshold voltage of the transistor 550 can be controlled. In particular, when a negative potential is applied to the well region 372, the threshold voltage of the transistor 550 can be further increased, and the off-state current can be reduced. Thus, a negative potential is applied to the well region 372, so that a drain current when a potential applied to a gate electrode of the Si transistor is 0 V can be reduced. As a result, power consumption due to shoot-through current or the like in the arithmetic circuit including the transistor 550 can be reduced, and the arithmetic efficiency can be improved.

The transistor 550 preferably has a structure in which the top surface and the side surface in the channel width direction of the semiconductor layer are covered with a conductor 378 with an insulator 377 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 378 sometimes functions as a first gate (also referred to as a top gate) electrode. In addition, the well region 372 sometimes functions as a second gate (also referred to as a bottom gate) electrode. In that case, a potential applied to the well region 372 can be controlled through the low-resistance region 376c.

A region of the semiconductor region 375 where a channel is formed, a region in the vicinity thereof, the low-resistance region 376a and the low-resistance region 376b each functioning as a source region or a drain region, the low-resistance region 376c connected to an electrode controlling a potential of the well region 372, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. It is possible to employ a structure in which silicon whose effective mass is controlled by applying stress to the crystal lattice and changing the lattice spacing is used. Alternatively, the transistor 550 may be a HEMT with the use of GaAs and GaAlAs, or the like.

The well region 372, the low-resistance region 376a, the low-resistance region 376b, and the low-resistance region 376c contain an element which imparts n-type conductivity, such as arsenic or phosphorus, or an element which imparts p-type conductivity, such as boron, in addition to the semiconductor material used for the semiconductor region 375.

For the conductor 378 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used. Alternatively, silicide such as nickel silicide may be used for the conductor 378.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

To form each of the low-resistance region 376a, the low-resistance region 376b, and the low-resistance region 376c, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 378 functioning as a gate electrode and the side surface of the insulator functioning as a gate insulating film. This structure can prevent the conductor 378 and the low-resistance region 376a and the low-resistance region 376b from being brought into a conduction state.

An insulator 379, an insulator 381, an insulator 383, and an insulator 385 are stacked in this order to cover the transistor 550.

For the insulator 379, the insulator 381, the insulator 383, and the insulator 385, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 381 may have a function of a planarization film for eliminating a level difference caused by the transistor 550 or the like provided below the insulator 381. For example, a top surface of the insulator 381 may be planarized by planarization treatment using a chemical mechanical polishing (CMP) method or the like to improve planarity.

In addition, for the insulator 383, it is preferable to use a film having a barrier property that prevents diffusion of hydrogen or impurities from the substrate 371, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 383 that is converted into hydrogen atoms per area of the insulator 383 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 385 is preferably lower than that of the insulator 383. For example, the dielectric constant of the insulator 385 is preferably lower than 4, further preferably lower than 3. The dielectric constant of the insulator 385 is, for example, preferably 0.7 times or less, further preferably 0.6 times or less the dielectric constant of the insulator 383. When a material with a low permittivity is used for an interlayer film, parasitic capacitance generated between wirings can be reduced.

A conductor 328, a conductor 330, and the like that are connected to the transistor 500 are embedded in the insulator 379, the insulator 381, the insulator 383, and the insulator 385. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 385 and the conductor 330. For example, in FIG. 14, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 383, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 14, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 383, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 14, an insulator 370, an insulator 369, and an insulator 368 are provided to be stacked in this order. Furthermore, a conductor 376 is formed in the insulator 370, the insulator 369, and the insulator 368. The conductor 376 has a function of a plug or a wiring. Note that the conductor 376 can be provided using a material similar to those for the conductor 328 and the conductor 330.

Note that for example, like the insulator 383, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 368 and the conductor 376. For example, in FIG. 14, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 383, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen and hydrogen is preferably used for any of the insulator 510, the insulator 512, the insulator 514, and the insulator 516.

For example, for the insulator 510 and the insulator 514, it is preferable to use a film having a barrier property against hydrogen and impurities diffused from the substrate 371, a region where the transistor 550 is provided, or the like into the region where the transistor 500 is provided. Therefore, a material similar to that for the insulator 383 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has a high blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 379 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 15A to FIG. 15C, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 15B and FIG. 15C, an insulator 544 is preferably positioned between the insulator 580 and the oxide 530a, the oxide 530b, the conductor 542a, and the conductor 542b. Furthermore, as illustrated in FIG. 15A to FIG. 15C, the conductor 560 preferably includes a conductor 560a provided inside the insulator 545 and a conductor 560b provided to be embedded inside the conductor 560a. Moreover, as illustrated in FIG. 15B and FIG. 15C, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 14 and FIG. 15A to FIG. 15C is an example, and the structures are not limited thereto; an appropriate transistor can be used in accordance with a circuit configuration and/or a driving method.

Here, the conductor 560 functions as a gate electrode of the transistor 500, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a gate or a top gate) electrode. In addition, the conductor 503 sometimes functions as a second gate (also referred to as a back gate or a bottom gate) electrode. In that case, the threshold voltage of the transistor 500 can be controlled by changing a potential applied to the conductor 503 not in synchronization with but independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although a structure of the transistor 500 in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material having a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 is illustrated to have a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose VoH is sufficiently reduced. When an oxide semiconductor with sufficiently reduced impurities such as VoH is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoHVo-FH" occurs. Part of hydrogen generated at this time is bonded to oxygen to be H$_2$O, and removed from the oxide 530 or an insulator in the vicinity of the oxide 530 in some cases. Some hydrogen may be gettered into the conductor 542a and the conductor 542b in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in the following manner: heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in the following manner: heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (or that the above oxygen be less likely to pass through the insulator 522).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 and the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high dielectric constant.

Note that in the transistor 500 in FIG. 15A to FIG. 15C, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is used as the oxide 530 including a channel formation region. For example, as the oxide 530, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 15B, a stacked-layer structure of two or more layers may be employed. For example, a tantalum nitride film and a tungsten film may be stacked. Alternatively, a titanium film and an aluminum film may be stacked. Moreover, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 15B, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) decreases in some cases. In addition, a metal compound layer that contains the metal contained in the conductor 542a (the conductor 542b) and the component of the oxide 530 is formed in the region 543a (the region 543b) in some cases. In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. In addition, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not necessarily provided when the conductor 542a and the conductor 542b are oxidation-resistant materials or do not significantly lose their conductivity even after absorbing oxygen. Design is appropriately determined in consideration of required transistor characteristics.

The insulator 544 can inhibit impurities such as water and hydrogen contained in the insulator 580 from diffusing into the oxide 530b. Furthermore, oxidation of the conductor 542 can be inhibited by excess oxygen contained in the insulator 580.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. The above-described microwave treatment may be performed before and/or after the insulator 545 is formed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 can be used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 functioning as the first gate electrode is illustrated to have a two-layer structure in FIG. 15B and FIG. 15C, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (N20, NO, NO2, and the like), and a copper atom. Alternatively, it is preferable to use a conductive material that has a function of inhibiting the diffusion of oxygen (e.g., at least one of an oxygen atom, an oxygen molecule, and the like). When the conductor 560a has a function of inhibiting diffusion of oxygen, a reduction in conductivity of the conductor 560b due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, a conductor having high conductivity is preferably used, because the conductor 560b also functions as a wiring. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structure of the conductor 540a and the conductor 540b are similar to a structure of a conductor 546 and a conductor 548 that will be described later.

An insulator 582 is provided over the insulator 581. A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that prevents both oxygen and impurities such as hydrogen and moisture which are factors of change in electrical characteristics of the transistor from passing through the film. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 379 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the transistor 500 or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are preferred because these formation steps can also serve as part of the manufacturing steps of the transistor 500. The insulator having a high barrier property against hydrogen or water may be formed using a material similar to that for the insulator 522 or the insulator 514, for example.

In addition, a conductor 612 may be provided over the conductor 546 and the conductor 548. The conductor 612 has a function of a plug or a wiring that is connected to the transistor 500. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For a conductive material, it is preferable to use a high-melting-point material that has both heat resistance and conductivity, such as tungsten or molybdenum, and it is particularly preferable to use tungsten. In addition, in the case where the conductor is formed concurrently with another component such as a conductor, Cu (copper), Al (aluminum), or the like, which is a low-resistance metal material, may be used.

An insulator 640 is provided over the insulator 586, the conductor 612, and the conductor 610. For the insulator 640, a material similar to that for the insulator 379 can be used. In addition, the insulator 640 may also function as a planarization film that covers an uneven shape therebelow.

With the use of this structure, a semiconductor device using a transistor including an oxide semiconductor can be miniaturized or highly integrated.

<Modification Example of Transistor>

Figure 16A:
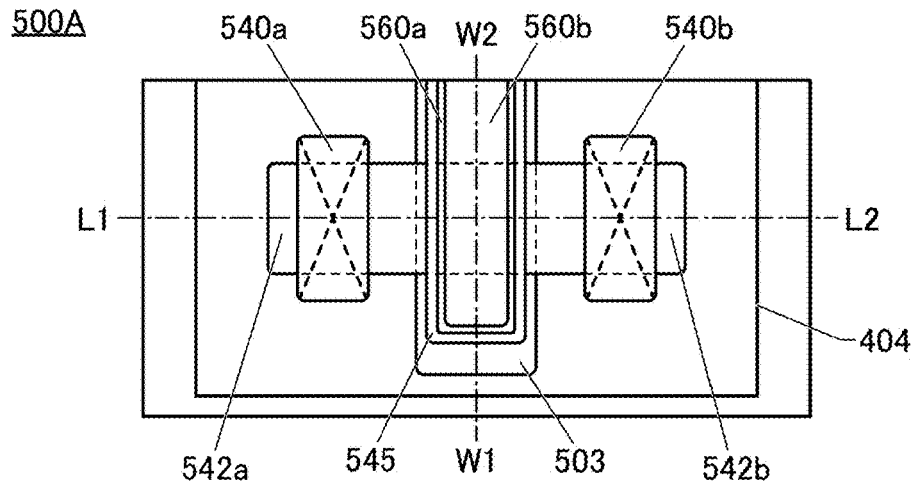
FIG. 16A to FIG. 16C are diagrams illustrating a structure example of a transistor.
Figure 16B:
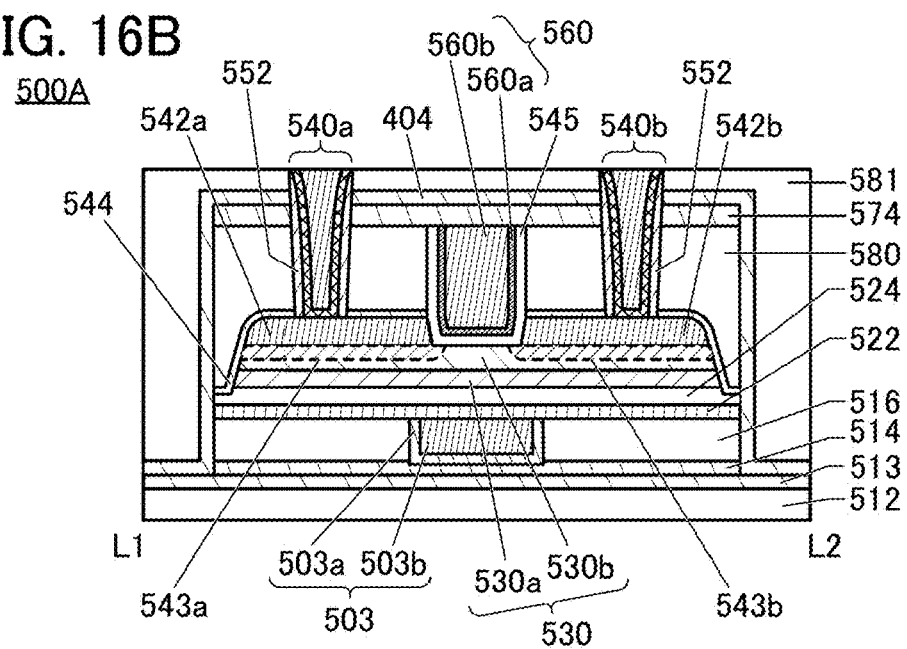
Figure 16C:
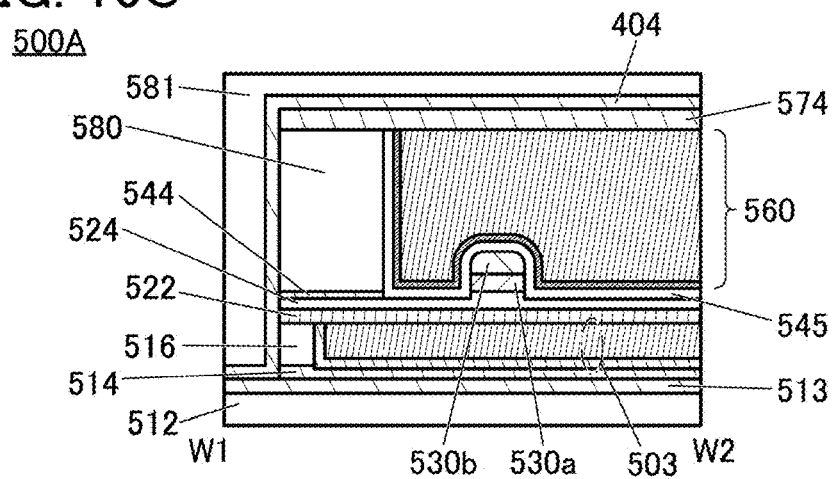

A transistor 500A illustrated in FIG. 16A to FIG. 16C is a modification example of the transistor 500 having the structure illustrated in FIG. 15A to FIG. 15C. FIG. 16A is a top view of the transistor 500A, FIG. 16B is a cross-sectional view of the transistor 500A in the channel length direction, and FIG. 16C is a cross-sectional view of the transistor 500A in the channel width direction. Note that for clarity of the drawing, some components are not illustrated in the top view in FIG. 16A. Note that the structure illustrated in FIG. 16A to FIG. 16C can also be applied to other transistors such as the transistor 550 included in the semiconductor device of one embodiment of the present invention.

The transistor 500A having the structure illustrated in FIG. 16A to FIG. 16C is different from the transistor 500 having the structure illustrated in FIG. 15A to FIG. 15C in including an insulator 552, an insulator 513, and an insulator 404. The transistor 500A is different from the transistor 500 in that the insulator 552 is provided in contact with a side surface of the conductor 540a and the insulator 552 is provided in contact with a side surface of the conductor 540b. Furthermore, the transistor 500A is different from the transistor 500 in not including the insulator 520.

In the transistor 500A, the insulator 513 is provided over the insulator 512. In addition, the insulator 404 is provided over the insulator 574 and the insulator 513. In the transistor 500A, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide, which is a material having a high hydrogen barrier property, is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or a water molecule. For example, for the insulator 552, an insulator such as silicon nitride, aluminum oxide, or silicon nitride oxide that is a material having a high hydrogen barrier property is preferably used. In particular, it is suitable to use silicon nitride for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

The configuration, structure, method, or the like described in this embodiment can be used in combination with the configuration, structures, methods, or the like described in the other embodiments and the like as appropriate.

Embodiment 3

Described in this embodiment is a metal oxide (hereinafter also referred to as an oxide semiconductor) that can be used in an OS transistor described in the above embodiment.

The metal oxide preferably contains one of indium and zinc. In particular, indium and zinc are preferably contained. In addition to them, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 17A. FIG. 17A is a diagram showing classification of crystal structures of an oxide semiconductor, typically IGZO (a metal oxide containing In, Ga, and Zn).

As shown in FIG. 17A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite). Note that the term "Crystalline" excludes single crystal, poly crystal, and completely amorphous. The term "Crystal" includes single crystal and poly crystal.

Note that the structures in the thick frame illustrated in FIG. 17A are in an intermediate state between "Amorphous" and "Crystal", and belong to a new crystalline phase. In other words, these structures are completely different from "Amorphous", which is energetically unstable, and "Crystal".

A crystal structure of a film or a substrate can be analyzed with an X-ray diffraction (XRD) spectrum. FIG. 17B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 17B and obtained by GIXD measurement is hereinafter simply referred to as an XRD spectrum. The CAAC-IGZO film in FIG. 17B has a composition in the vicinity of In:Ga:Zn=4:2:3 [atomic ratio]. The CAAC-IGZO film in FIG. 17B has a thickness of 500 nm.

As shown in FIG. 17B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 17B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 17C shows a diffraction pattern of a CAAC-IGZO film. FIG. 17C shows a diffraction pattern obtained with the NBED method in which an electron beam is incident in the direction parallel to the substrate. The CAAC-IGZO film in FIG. 17C has a composition in the vicinity of In:Ga:Zn=4:2:3 [atomic ratio]. In the nanobeam electron diffraction method, electron diffraction is performed with a probe diameter of 1 nm.

As shown in FIG. 17C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 17A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and accordingly decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than those of the second region. Moreover, the second region has higher [Ga] and lower [In] than those of the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility (μ) and a favorable switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^3$, preferably lower than or equal to $1\times10^{15}$ cm$^3$, further preferably lower than or equal to $1\times10^{13}$ cm$^3$, still further preferably lower than or equal to $1\times10^{11}$ cm$^3$, yet further preferably lower than $1\times10^{10}$ cm$^3$, and higher than or equal to $1\times10^{-9}$ cm$^3$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentrations of silicon and carbon in the oxide semiconductor and the concentrations of silicon and carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The configuration, structure, method, or the like described in this embodiment can be used in combination with the configuration, structure, method, or the like described in the other embodiments and the like as appropriate.

Embodiment 4

In this embodiment, an IC chip, an electronic component, electronic devices, and the like will be described as examples of a semiconductor device.

<Example of Method for Manufacturing Electronic Component>

Figure 18A:
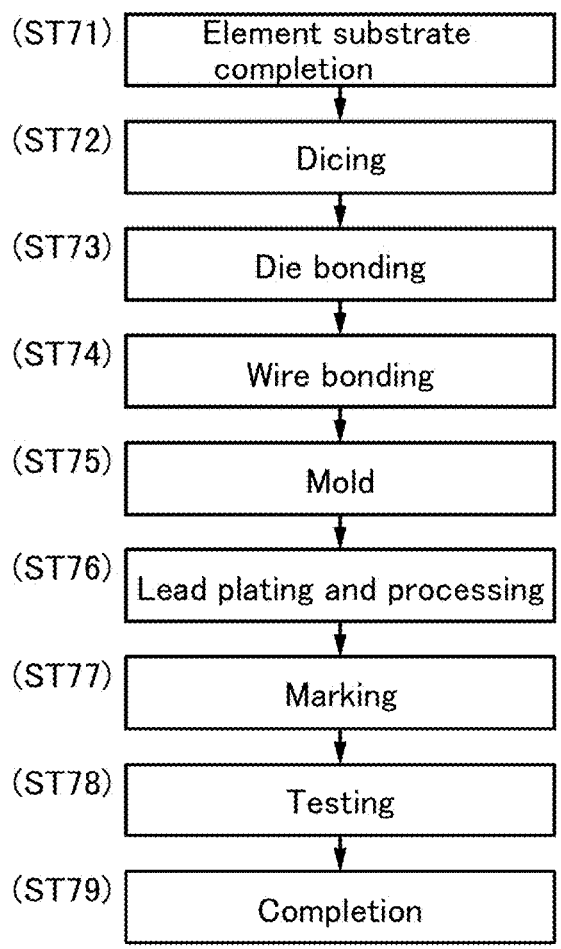
FIG. 18A is a flow chart showing an example of a method for manufacturing an electronic component.

FIG. 18A is a flow chart showing an example of a method for fabricating an electronic component. The electronic component is also referred to as a semiconductor package or an IC package. For the electronic component, there are a plurality of standards and names corresponding to a terminal extraction direction and a terminal shape. Thus, an example thereof is described in this embodiment.

A semiconductor device formed with transistors is completed by integrating detachable components on a printed circuit board through an assembly process (post-process).

The post-process can be completed through steps shown in FIG. 18A. Specifically, after an element substrate obtained in a pre-process is completed (Step ST71), a back surface of the substrate is ground. The substrate is thinned in this step to reduce warpage or the like of the substrate in the pre-process and to reduce the size of the component. Then, a dicing step of dividing the substrate into a plurality of chips is performed (Step ST72).

Figure 18B:
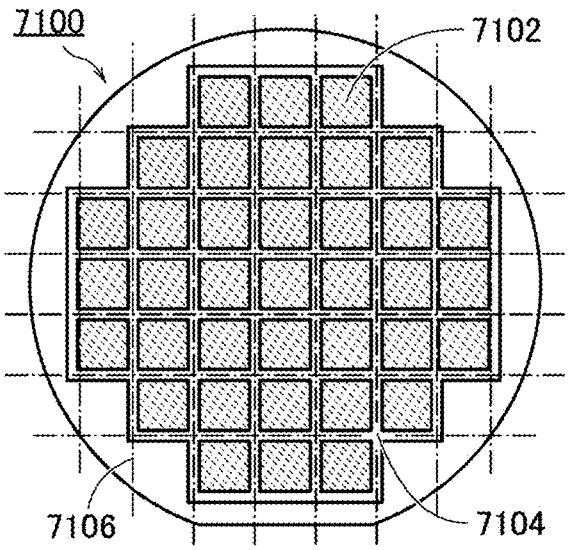
FIG. 18B is a top view of a semiconductor wafer.
Figure 18C:
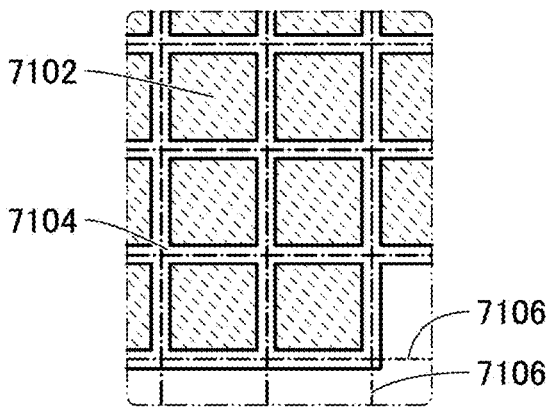
FIG. 18C is an enlarged view of a part of the semiconductor wafer.

FIG. 18B is a top view of a semiconductor wafer 7100 before a dicing process. FIG. 18C is a partial enlarged view of part of FIG. 18B. A plurality of circuit regions 7102 are provided on the semiconductor wafer 7100. A semiconductor device (e.g., a holding circuit, a memory device, an imaging device, or an MCU) of an embodiment of the present invention is provided on each of the circuit regions 7102.

Figure 18D:
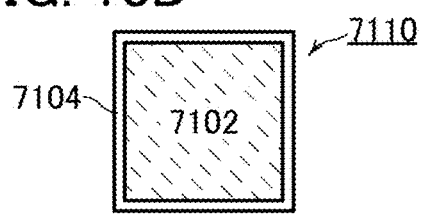
FIG. 18D is a schematic view of a chip.

The plurality of circuit regions 7102 are each surrounded by a separation region 7104. Separation lines (also referred to as "dicing lines") 7106 are set at positions overlapping with the separation region 7104. In the dicing step (Step ST72), the semiconductor wafer 7100 is cut along the separation lines 7106, whereby chips 7110 including the circuit regions 7102 are cut out from the semiconductor wafer 7100. FIG. 18D is an enlarged view of the chip 7110.

A conductive layer or a semiconductor layer may be provided in the separation region 7104. Providing a conductive layer or a semiconductor layer in the separation region 7104 relieves ESD that might be caused in the dicing step, preventing a decrease in the yield due to the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Therefore, the cost of manufacturing the semiconductor device can be reduced. Moreover, the productivity of the semiconductor device can be increased.

After Step ST72, the divided chips are separately picked up, placed on a lead frame, and bonded thereto in a die bonding step (Step ST73). As a method for bonding the chip to the lead frame in the die bonding step, a method suitable for the product may be selected. The bonding may be performed, for example, with a resin or a tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing the chip with an epoxy resin or the like (Step ST75). With the molding step, the inside of the electronic component is filled with a resin, so that damage to the incorporated circuit portions and wires due to external mechanical force can be reduced, and degradation in characteristics due to moisture or dust can be reduced. The lead of the lead frame is subjected to plating treatment. After that, the lead is cut and processed (Step ST76). This plating treatment prevents rust of the lead and enables more reliable soldering at the time of mounting the electronic component on a printed circuit board later. Printing treatment (marking) is performed on a surface of the package (Step ST77). After a testing step (Step ST78), the electronic component is completed (Step ST79). When an electronic component includes the semiconductor device of the above embodiment, the electronic component with low power consumption and a small size can be provided.

Figure 18E:
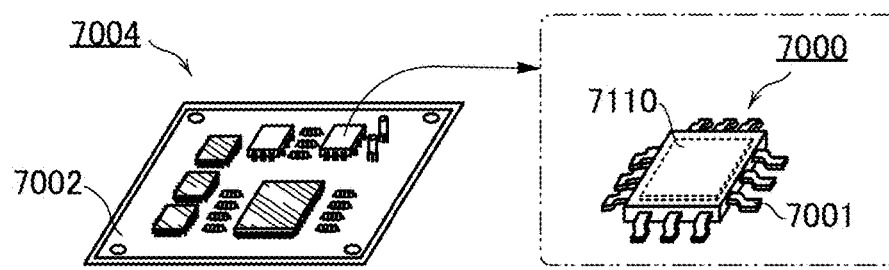
FIG. 18E is a schematic perspective view illustrating a structure example of an electronic component.

FIG. 18E shows a schematic perspective view of the completed electronic component. FIG. 18E shows a schematic perspective view of a QFP (Quad Flat Package) as an example of the electronic component. As shown in FIG. 18E, an electronic component 7000 includes a lead 7001 and a chip 7110.

The electronic component 7000 is mounted on a printed circuit board 7002, for example. A plurality of electronic components 7000 which are combined and electrically connected to each other over the printed circuit board 7002 can be mounted on an electronic device. A completed circuit board 7004 is provided in an electronic device or the like. Mounting the electronic components 7000 achieves a reduction in the power consumption of the electronic device. Alternatively, the electronic device can easily have a smaller size.

The electronic component 7000 can be used as an electronic component (IC chip) of electronic devices in a wide range of fields, such as digital signal processing, software-defined radio systems, avionics (electronic devices related to aviation, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PC), mobile phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATM), vending machines, and consumer electronics.

The configuration, structure, method, or the like described in this embodiment can be used in combination with the configuration, structure, method, or the like described in the other embodiments and the like as appropriate.

Embodiment 5

In this embodiment, an example of an electronic device including a semiconductor device of one embodiment of the present invention is described. FIG. 19A to FIG. 19J illustrates examples of the electronic device. Note that FIG. 19A to FIG. 19J illustrate electronic devices each including the electronic component 7000 that includes the semiconductor device of one embodiment of the present invention.

In a variety of electronic devices, AD conversion in which a variety of analog data such as, acoustic data, imaging data, illuminance data, and temperature data, is converted into digital data, is performed in some cases. When the semiconductor device of one embodiment of the present invention is used in electronic devices, AD conversion in which an increase in power consumption is suppressed can be performed. That is, when the semiconductor device of one embodiment of the present invention is used in electronic device, power consumption can be reduced. Furthermore, AD conversion with high accuracy can be achieved by using the semiconductor device of one embodiment of the present invention. Still furthermore, a high-speed AD conversion can be achieved by using the semiconductor device of one embodiment of the present invention.

[Mobile Phone]

Figure 19A:
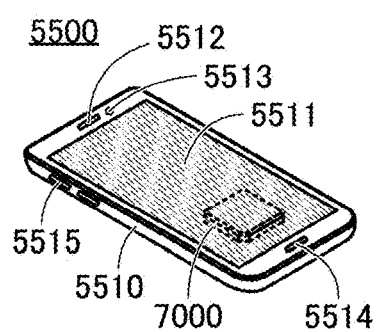
FIG. 19A to FIG. 19J are diagrams illustrating examples of electronic devices.

An information terminal 5500 illustrated in FIG. 19A is a mobile phone (smartphone), which is a type of information terminal. The information terminal 5500 includes a housing 5510, a display portion 5511, a speaker 5512, a camera 5513, a microphone 5514, and the like, and as input interfaces, a touch panel is provided in the display portion 5511 and operation buttons 5515 is provided in the housing 5510.

The information terminal 5500 can retain a temporary file generated at the time of executing an application (e.g., a web browser's cache or the like). In the information terminal 5500, AD conversion or the like in which a variety of analog data such as, acoustic data, imaging data, and illuminance data, is converted into digital data, is performed.

[Wearable Terminal]

Figure 19B:
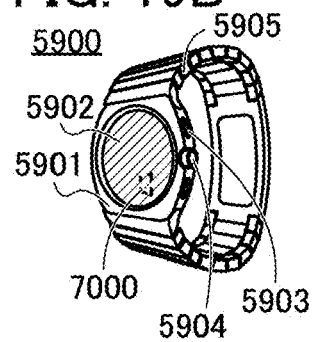

In addition, FIG. 19B illustrates an information terminal 5900 that is an example of a wearable terminal. The information terminal 5900 includes a housing 5901, a display portion 5902, operation switches 5903, an operation switch 5904, a band 5905, and the like.

The information terminal 5900 includes various kinds of sensors such as temperature sensor, pressure sensor, and illuminance sensor. In the information terminal 5900, AD conversion in which analog data obtained by those sensors is converted into digital data is performed.

[Information Terminal]

Figure 19C:
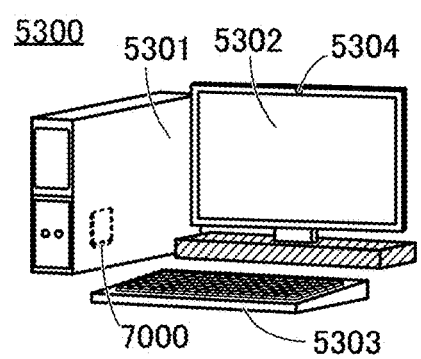

In addition, FIG. 19C illustrates a desktop information terminal 5300. The desktop information terminal 5300 includes a main body 5301 of the information terminal, a display portion 5302, a keyboard 5303, a camera 5304, and the like.

Like the information terminal 5500 described above, in the desktop information terminal 5300, the AD conversion in which a variety of analog data is converted into digital data is performed.

Note that although the smartphone, the wearable terminal, and the desktop information terminal are respectively illustrated in FIG. 19A to FIG. 19C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 19D:
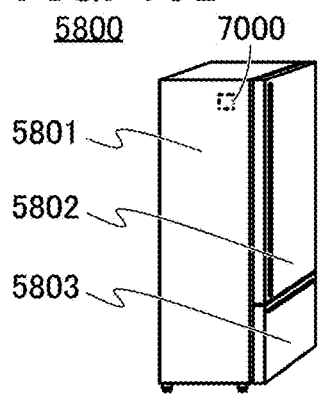

In addition, FIG. 19D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal or the like via the Internet. In the electric refrigerator-freezer 5800, AD conversion or the like in which a variety of analog data such as the temperature in the refrigerator is converted into digital data, is performed.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, an audiovisual appliance, and the like.

[Game Machine]

Figure 19E:
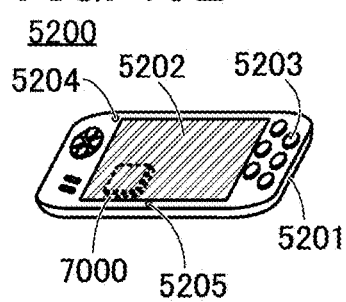

In addition, FIG. 19E illustrates a portable game machine 5200 as an example of a game machine. The portable game machine 5200 includes a housing 5201, a display portion 5202, operation switches 5203, an illuminance sensor 5204, a microphone 5205, and the like.

Figure 19F:
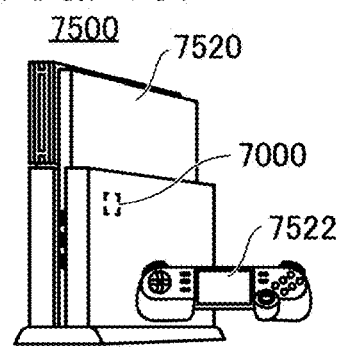

In addition, FIG. 19F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 19F, the controller 7522 can include a display portion that displays a game image, and an input interface besides operation switches, such as a touch panel, a stick, a rotating knob, a sliding knob, and a microphone, for example. Moreover, the shape of the controller 7522 is not limited to that illustrated in FIG. 19F, and the shape of the controller 7522 may be changed in various ways in accordance with the genres of games. For example, for a shooting game such as an FPS (First Person Shooter) game, a gun-shaped controller having a trigger as an operation switch can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

In addition, images displayed on the game machine can be output with a display device such as a television device, a personal computer display, a game display, or a head-mounted display.

AD conversion in which a variety of analog data is converted into digital data, is performed also in the portable game machine 5200, the stationary game machine 7500, or the like. The semiconductor device of one embodiment of the present invention is employed for the portable game machine 5200, the stationary game machine 7500, or the like, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Although the portable game machine 5200 and the stationary game machine 7500 are each illustrated as a game machine of one kind of the electronic devices, examples of the electronic device of one embodiment of the present invention include an arcade game machine installed in entertainment facilities (a game center, an amusement park, and the like), a throwing machine for batting practice installed in sports facilities, and the like.

[Moving Vehicle]

The semiconductor device described in the above embodiment can be used for a motor vehicle, which is a moving vehicle, and around the driver's seat in a motor vehicle.

Figure 19G:
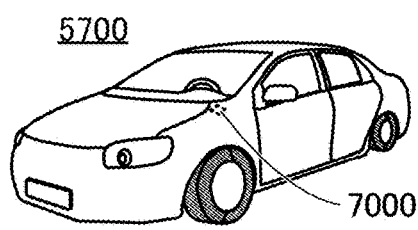

FIG. 19G illustrates a motor vehicle 5700 as an example of a moving vehicle.

An instrument panel that provides various kinds of information by displaying a speedometer, an engine speed, a mileage, a fuel level, a gearshift state, air-conditioning settings, and the like is provided around the driver's seat in the motor vehicle 5700. In addition, a display device showing the above information may be provided around the driver's seat.

In particular, a video from the display device and an imaging device (not illustrated) provided outside the motor vehicle 5700 can compensate for the view obstructed by a pillar or the like and blind areas for the driver's seat, and the like, which can increase safety.

In the motor vehicle 5700, AD conversion in which a variety of analog data is converted into digital data, is performed, for example. The digital data obtained by the AD conversion is used for an automatic driving system, a navigation system, a system for a risk prediction, or the like. The semiconductor device of one embodiment of the present invention can perform AD conversion with high accuracy. Alternatively, the semiconductor device of one embodiment of the present invention can perform a high-speed AD conversion. With the use of the semiconductor device of one embodiment of the present invention, accuracy of arithmetic processing for automatic driving, navigation, risk prediction, and the like can be increased. With the use of the semiconductor device of one embodiment of the present invention, arithmetic processing speed for automatic driving, navigation, risk prediction, and the like can be increased.

Note that although a motor vehicle is described above as an example of a moving vehicle, the moving vehicle is not limited to a motor vehicle. Examples of moving vehicles include a train, a monorail train, a ship, and a flying object (a helicopter, an unmanned aircraft (a drone), an airplane, and a rocket).

[Camera]

The semiconductor device of one embodiment of the present invention can be employed for a camera.

Figure 19H:
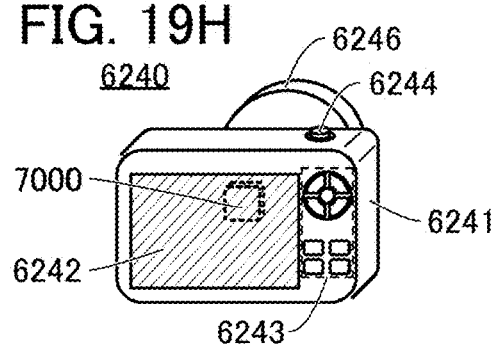

FIG. 19H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device of one embodiment of the present invention is employed for the digital camera 6240, high-speed AD conversion can be achieved. Moreover, heat generation from a circuit can be decreased owing to reduced power consumption; thus, the influence of heat generation on the circuit itself, a peripheral circuit, and a module can be reduced.

[Video Camera]

The semiconductor device described in the above embodiment can be employed for a video camera.

Figure 19I:
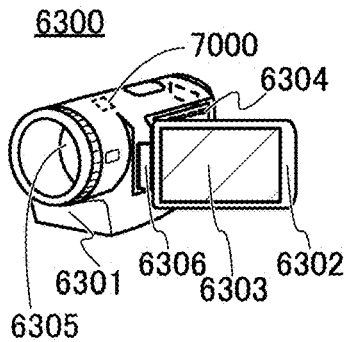

FIG. 19I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

The use of the semiconductor device of one embodiment of the present invention for the video camera 6300 enables a high-speed AD conversion. Moreover, heat generation from a circuit can be decreased owing to reduced power consumption; thus, the influence of heat generation on the circuit itself, a peripheral circuit, and a module can be reduced.

[ICD]

The semiconductor device described in the above embodiment can be employed for an implantable cardioverter-defibrillator (ICD).

Figure 19J:
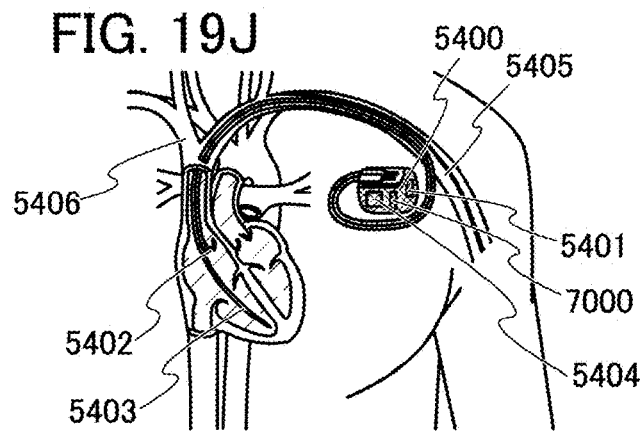

FIG. 19J is a schematic cross-sectional view illustrating an example of an ICD. An ICD main unit 5400 includes at least a battery 5401, the electronic component 7000, a regulator, a control circuit, an antenna 5404, a wire 5402 reaching a right atrium, and a wire 5403 reaching a right ventricle.

The ICD main unit 5400 is implanted in the body by surgery, and two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 7000.

In addition, the antenna 5404 can receive electric power, and the battery 5401 is charged with the electric power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

The use of the semiconductor device of one embodiment of the present invention for the ICD main unit 5400 enables a high-speed AD conversion. Moreover, heat generation from a circuit can be decreased owing to reduced power consumption; thus, the influence of heat generation on the circuit itself, a peripheral circuit, and a module can be reduced. Accordingly, the reliability of the ICD main unit 5400 can be improved.

The configuration, structure, method, or the like described in this embodiment can be used in combination with the configuration, structure, method, or the like described in the other embodiments and the like as appropriate.

REFERENCE NUMERALS

100: semiconductor device, 110: differential circuit, 111: transistor, 112: transistor, 113: transistor, 114: transistor, 115: transistor, 120: latch circuit, 121: transistor, 122: transistor, 123: transistor, 124: transistor, 125: transistor, 126: transistor, 127: transistor

The invention claimed is:

1. A semiconductor device comprising:
a differential circuit; and
a latch circuit,
wherein the differential circuit comprises a transistor including an oxide semiconductor in a channel formation region,
wherein the latch circuit comprises a transistor including silicon or gallium nitride in a channel formation region, and
wherein the differential circuit and the latch circuit comprise an overlap region.

2. A semiconductor device according to claim 1,
wherein the latch circuit comprises a transistor including an oxide semiconductor in a channel formation region.

3. A semiconductor device according to claim 1,
wherein the oxide semiconductor contains at least one of indium and zinc.

4. A semiconductor device comprising:
a differential circuit; and
a latch circuit,
wherein the differential circuit comprises first to fifth transistors,
wherein the latch circuit comprises sixth to twelfth transistors,
wherein each of the first to fifth transistors, the eleventh transistor, and the twelfth transistor comprises an oxide semiconductor in a channel formation region,
wherein each of the sixth to tenth transistors comprises silicon or gallium nitride in a channel formation region, and
wherein a first layer comprising the sixth to tenth transistors and a second layer comprising the first to fifth transistors, the eleventh transistor, and the twelfth transistor comprise an overlap region.

5. A semiconductor device according to claim 4,
wherein one of a source and a drain of the first transistor is electrically connected to a first terminal,
wherein the other of the source and the drain of the first transistor is electrically connected to one of a source and a drain of the third transistor,
wherein one of a source and a drain of the second transistor is electrically connected to the first terminal,
wherein the other of the source and the drain of the second transistor is electrically connected to one of a source and a drain of the fourth transistor,
wherein the other of the source and the drain of the third transistor and the other of the source and the drain of the fourth transistor are electrically connected to one of a source and a drain of the fifth transistor,
wherein a gate of the first transistor and a gate of the second transistor are electrically connected to a second terminal,
wherein a gate of the third transistor is electrically connected to a third terminal,
wherein a gate of the fourth transistor is electrically connected to a fourth terminal,
wherein a gate of the fifth transistor is electrically connected to a fifth terminal, and
wherein the other of the source and the drain of the fifth transistor is electrically connected to a sixth terminal.

6. A semiconductor device according to claim 5,
wherein one of a source and a drain of the sixth transistor is electrically connected to a seventh terminal,
wherein the other of the source and the drain of the sixth transistor is electrically connected to one of a source and a drain of the seventh transistor,
wherein the other of the source and the drain of the seventh transistor is electrically connected to one of a source and a drain of the ninth transistor,
wherein one of a source and a drain of the eighth transistor is electrically connected to the other of the source and the drain of the sixth transistor,
wherein a gate of the sixth transistor is electrically connected to an eighth terminal,
wherein the other of the source and the drain of the eighth transistor is electrically connected to one of a source and a drain of the tenth transistor,
wherein a gate of the seventh transistor and a gate of the ninth transistor is electrically connected to the one of the source and the drain of the tenth transistor,
wherein a gate of the eighth transistor and a gate of the tenth transistor is electrically connected to the one of the source and the drain of the ninth transistor,
wherein one of a source and a drain of the eleventh transistor is electrically connected to a ninth terminal and the one of the source and the drain of the ninth transistor,
wherein one of a source and a drain of the twelfth transistor is electrically connected to a tenth terminal and the one of the source and the drain of the tenth transistor,
wherein the other of the source and the drain of each of the ninth transistor, the tenth transistor, the eleventh transistor, and the twelfth transistor is electrically connected to an eleventh terminal,
wherein a gate of the eleventh transistor is electrically connected to the one of the source and the drain of the third transistor, and
wherein a gate of the twelfth transistor is electrically connected to the one of the source and the drain of the fourth transistor.

7. A semiconductor device according to claim 4,
wherein the oxide semiconductor contains at least one of indium and zinc.

8. A semiconductor device comprising:
a differential circuit; and
a latch circuit,
wherein the differential circuit comprises first to fifth transistors,
wherein the latch circuit comprises sixth to twelfth transistors,
wherein each of the first to fifth transistors, the eleventh transistor, and the twelfth transistor comprises an oxide semiconductor in a channel formation region, and
wherein each of the sixth to tenth transistors comprises silicon or gallium nitride in a channel formation region.

9. A semiconductor device according to claim 8,
wherein one of a source and a drain of the first transistor is electrically connected to a first terminal,
wherein the other of the source and the drain of the first transistor is electrically connected to one of a source and a drain of the third transistor, wherein one of a source and a drain of the second transistor is electrically connected to the first terminal, wherein the other of the source and the drain of the second transistor is electrically connected to one of a source and a drain of the fourth transistor, wherein the other of the source and the drain of the third transistor and the other of the source and the drain of the fourth transistor are electrically connected to one of a source and a drain of the fifth transistor, wherein a gate of the first transistor and a gate of the second transistor are electrically connected to a second terminal, wherein a gate of the third transistor is electrically connected to a third terminal, wherein a gate of the fourth transistor is electrically connected to a fourth terminal, wherein a gate of the fifth transistor is electrically connected to a fifth terminal, and wherein the other of the source and the drain of the fifth transistor is electrically connected to a sixth terminal.

10. A semiconductor device according to claim 9, wherein one of a source and a drain of the sixth transistor is electrically connected to a seventh terminal, wherein the other of the source and the drain of the sixth transistor is electrically connected to one of a source and a drain of the seventh transistor, wherein the other of the source and the drain of the seventh transistor is electrically connected to one of a source and a drain of the ninth transistor, wherein one of a source and a drain of the eighth transistor is electrically connected to the other of the source and the drain of the sixth transistor, wherein a gate of the sixth transistor is electrically connected to an eighth terminal, wherein the other of the source and the drain of the eighth transistor is electrically connected to one of a source and a drain of the tenth transistor, wherein a gate of the seventh transistor and a gate of the ninth transistor is electrically connected to the one of the source and the drain of the tenth transistor, wherein a gate of the eighth transistor and a gate of the tenth transistor is electrically connected to the one of the source and the drain of the ninth transistor, wherein one of a source and a drain of the eleventh transistor is electrically connected to a ninth terminal and the one of the source and the drain of the ninth transistor, wherein one of a source and a drain of the twelfth transistor is electrically connected to a tenth terminal and the one of the source and the drain of the tenth transistor, wherein the other of the source and the drain of each of the ninth transistor, the tenth transistor, the eleventh transistor, and the twelfth transistor is electrically connected to an eleventh terminal, wherein a gate of the eleventh transistor is electrically connected to the one of the source and the drain of the third transistor, and wherein a gate of the twelfth transistor is electrically connected to the one of the source and the drain of the fourth transistor.

11. A semiconductor device according to claim 8, wherein the oxide semiconductor contains at least one of indium and zinc.

* * * * *